US012604503B2

(12) United States Patent
Lin

(10) Patent No.: US 12,604,503 B2
(45) Date of Patent: Apr. 14, 2026

(54) PROFILE CONTROL OF ISOLATION STRUCTURES IN SEMICONDUCTOR DEVICES

(71) Applicant: Taiwan Semiconductor Manufacturing Company, Ltd., Hsinchu (TW)

(72) Inventor: Tzu-Ging Lin, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 258 days.

(21) Appl. No.: 18/168,968

(22) Filed: Feb. 14, 2023

(65) Prior Publication Data

US 2024/0274662 A1 Aug. 15, 2024

(51) Int. Cl.
H10D 62/10 (2025.01)
H01L 21/3065 (2006.01)
(Continued)

(52) U.S. Cl.
CPC ....... H10D 62/121 (2025.01); H01L 21/3065 (2013.01); H01L 21/76224 (2013.01);
(Continued)

(58) Field of Classification Search
CPC .. H10D 64/017; H10D 62/121; H10D 30/014; H10D 30/43; H10D 30/6735; H10D 30/6757; H10D 62/115; H10D 62/118; H10D 62/119; H10D 62/113; H10D 62/116; H10D 10/054; H10D 30/0278; H10D 30/795; H10D 84/0151; H10D 84/0188; H10D 84/929; H10D 84/931;

H01L 21/3065; H01L 21/76224; H01L 21/30; H01L 21/302; H01L 21/306; H01L 21/30655; H01L 21/31; H01L 21/31051;
(Continued)

(56) References Cited

U.S. PATENT DOCUMENTS 9,093,530 B2 7/2015 Huang et al.
9,171,929 B2 10/2015 Lee et al.
(Continued)

FOREIGN PATENT DOCUMENTS

TW 202117855 A 5/2021

*Primary Examiner* — Moazzam Hossain
(74) *Attorney, Agent, or Firm* — Sterne, Kessler, Goldstein & Fox P.L.L.C.

(57) ABSTRACT

A semiconductor device and a method of fabricating the semiconductor device are disclosed. The method includes forming first and second nanostructured layers on first and second fin bases, forming cladding layers on sidewalls of the first and second nanostructured layers, forming a polysilicon structure on the first and second nanostructured layers, removing a portion of the polysilicon structure to form a first opening on the second nanostructured layers, removing a portion of the second nanostructured layers through the first opening to form a second opening on the second fin base, removing a portion of the second fin base through the second opening to form a third opening on the substrate, removing a portion of the substrate through the third opening to form a fourth opening in the substrate, and depositing an insulation material to fill the first, second, third, and fourth openings.

20 Claims, 38 Drawing Sheets

(51) Int. Cl.

| | |
|---|---|
| *H01L 21/762* | (2006.01) |
| *H10D 30/01* | (2025.01) |
| *H10D 30/43* | (2025.01) |
| *H10D 30/67* | (2025.01) |
| *H10D 64/01* | (2025.01) |

(52) U.S. Cl.
  CPC ........... *H10D 30/014* (2025.01); *H10D 30/43* (2025.01); *H10D 30/6735* (2025.01); *H10D 30/6757* (2025.01); *H10D 62/115* (2025.01); *H10D 64/017* (2025.01)

(58) Field of Classification Search
  CPC ........... H01L 21/31055; H01L 21/7627; H01L 21/763–764
  See application file for complete search history.

(56) References Cited

U.S. PATENT DOCUMENTS

| | | | |
|---|---|---|---|
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |
| 9,564,489 | B2 | 2/2017 | Yeo et al. |
| 9,576,814 | B2 | 2/2017 | Wu et al. |
| 9,601,342 | B2 | 3/2017 | Lee et al. |
| 9,608,116 | B2 | 3/2017 | Ching et al. |
| 2021/0126113 | A1 | 4/2021 | Lin et al. |
| 2021/0226009 | A1* | 7/2021 | Yang ................... H10D 30/021 |
| 2021/0226020 | A1* | 7/2021 | Lin ................... H10D 30/6757 |
| 2022/0384649 | A1 | 12/2022 | Ko et al. |
| 2023/0041640 | A1 | 2/2023 | Chu et al. |
| 2023/0197854 | A1* | 6/2023 | Guler ................. H10D 62/151 257/401 |

* cited by examiner

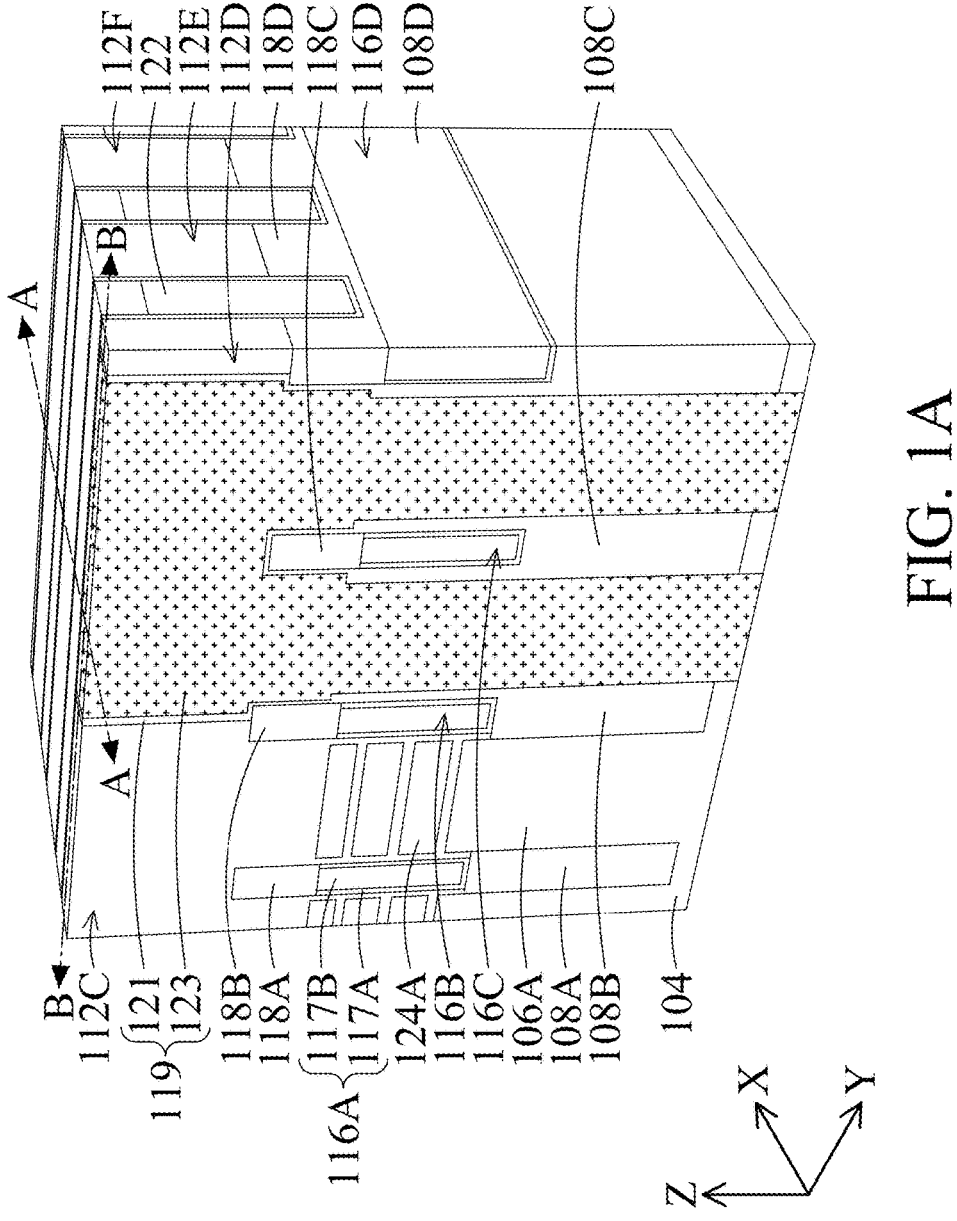
FIG. 1A

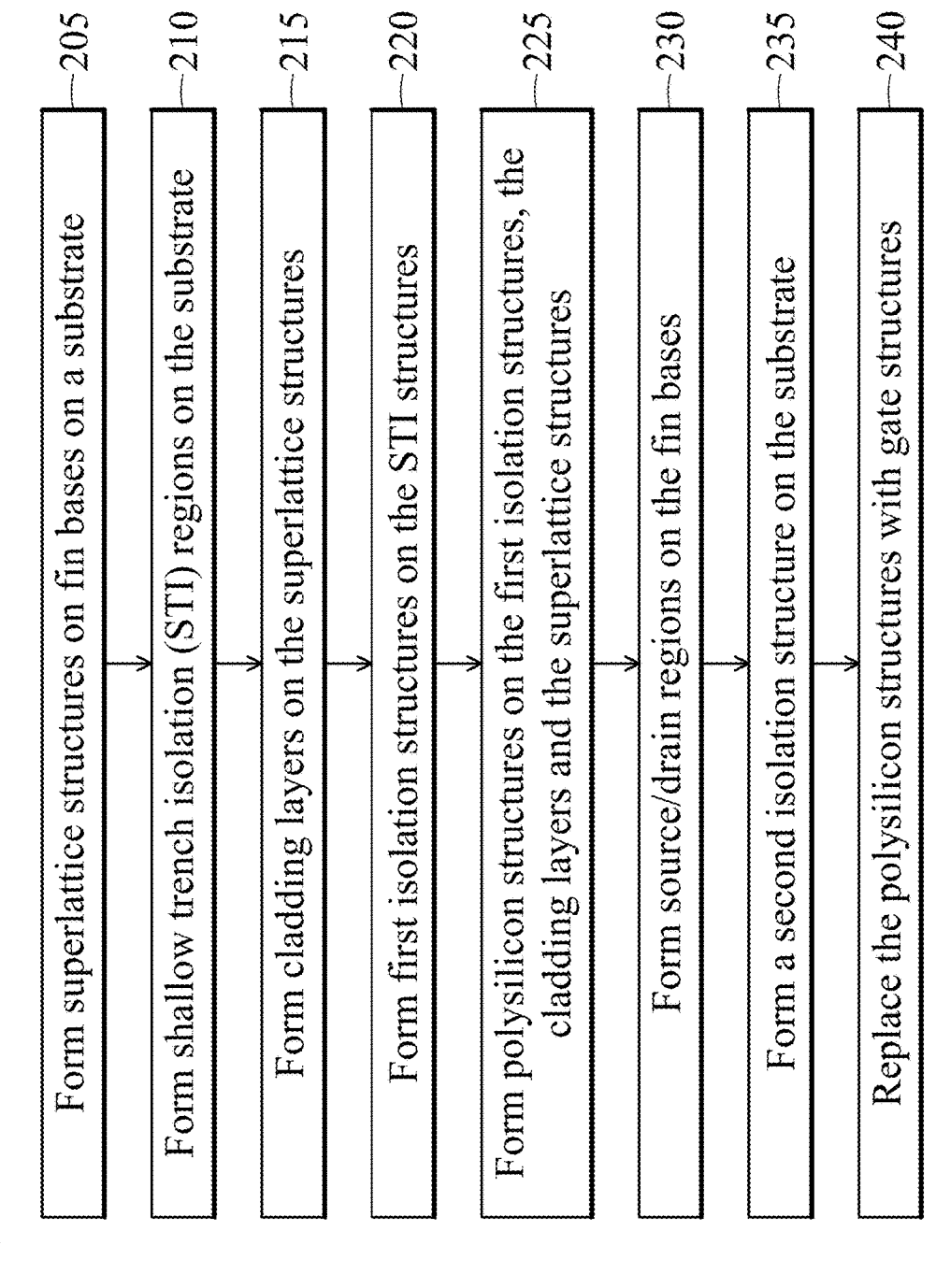

200

205 — Form superlattice structures on fin bases on a substrate

210 — Form shallow trench isolation (STI) regions on the substrate

215 — Form cladding layers on the superlattice structures

220 — Form first isolation structures on the STI structures

225 — Form polysilicon structures on the first isolation structures, the cladding layers and the superlattice structures 230 — Form source/drain regions on the fin bases 235 — Form a second isolation structure on the substrate 240 — Replace the polysilicon structures with gate structures

100
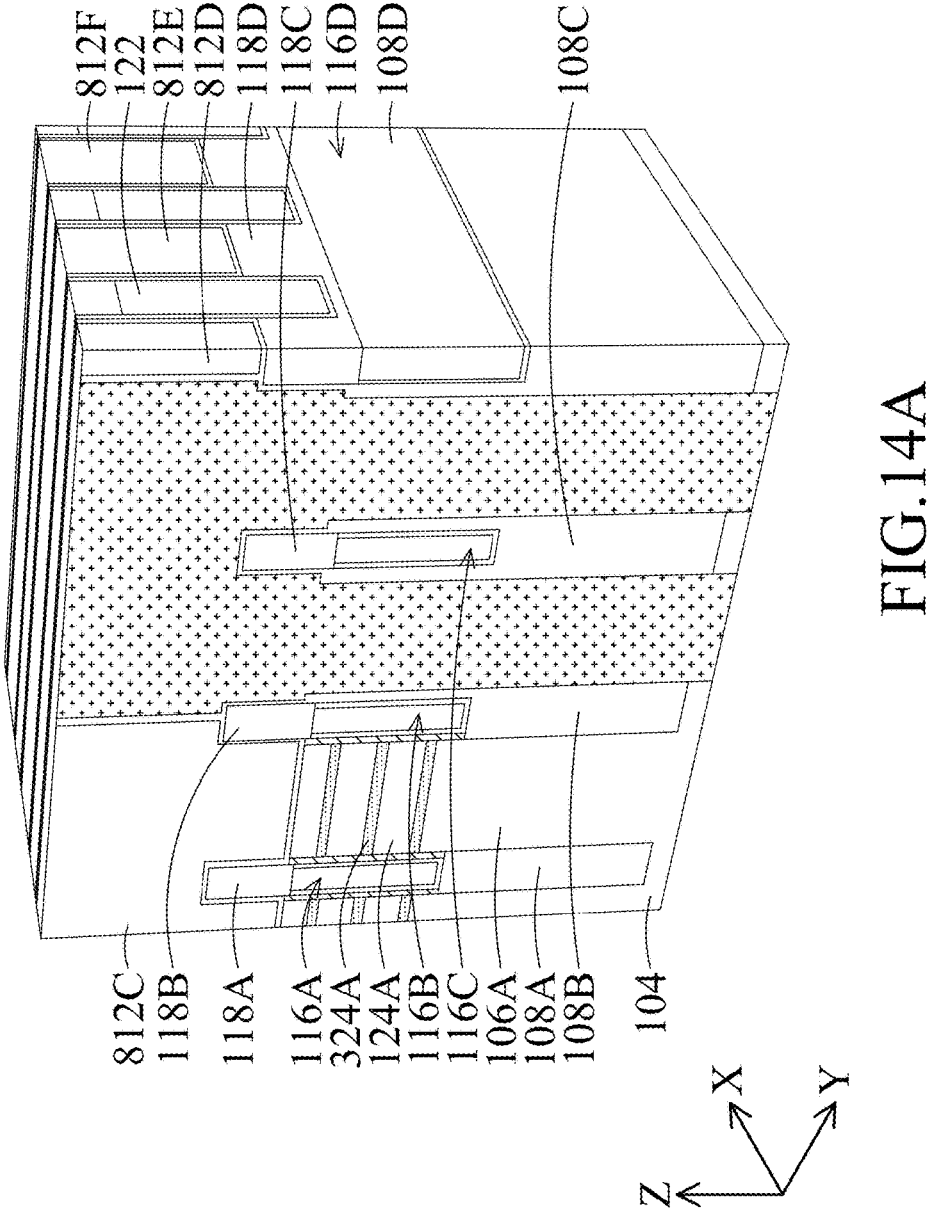
812F
122
812E
812D
118D
118C
116D
108D
108C
812C
118B
118A
116A
324A
124A
116B
116C
106A
108A
108B
104
Z
X
Y
FIG.14A

PROFILE CONTROL OF ISOLATION STRUCTURES IN SEMICONDUCTOR DEVICES

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), fin field effect transistors (finFETs), and gate-all-around (GAA) FETs. Such scaling down has increased the complexity of semiconductor manufacturing processes.

BRIEF DESCRIPTION OF THE DRAWINGS

Aspects of this disclosure are best understood from the following detailed description when read with the accompanying figures.

FIG. 1A illustrates an isometric view of a semiconductor device with an isolation structure, in accordance with some embodiments.

FIG. 2 is a flow diagram of a method for fabricating a semiconductor device with an isolation structure, in accordance with some embodiments.

FIGS. 3A-11C, 12A-12M, and 13A-15C illustrate cross-sectional views of a semiconductor device with an isolation structure at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1B:
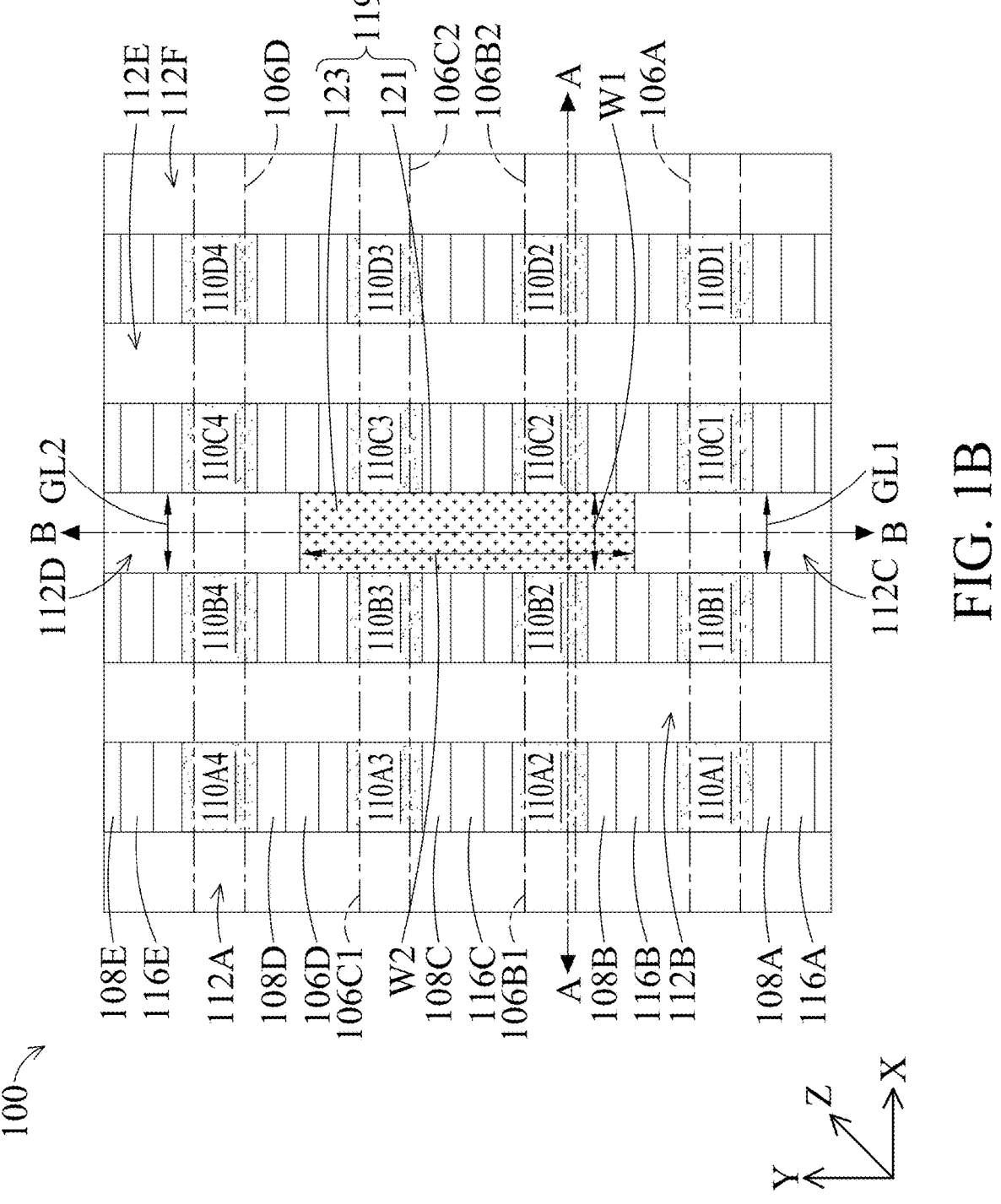
FIG. 1B illustrates a top-down view of a semiconductor device with an isolation structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

GAA FETs can include fin bases disposed on a substrate, stacks of nanostructured channel regions disposed on first portions of the fin bases, S/D regions disposed on second portions of the fin bases, gate structures surrounding each of the nanostructured channel regions, and shallow trench isolation (STI) regions disposed between adjacent fin bases. The GAA FETs can further include first and second isolation structures. The first isolation structures can be disposed on the STI regions and configured to electrically isolate adjacent source/drain (S/D) regions on different fin bases. The second isolation structures can be configured to electrically isolate adjacent groups of S/D regions on the same fin base. The second isolation structures can be formed by replacing the semiconductor material of the first portions of the fin bases with a dielectric material. However, the scaling down of semiconductor devices has increased the challenges of adequately removing the semiconductor material of the first portions of the fin bases. As a result, the challenges of preventing current leakage between the adjacent groups of S/D regions on the same fin base has increased. The presence of current leakage between the adjacent groups of S/D regions can degrade the performance and reliability of the GAA FETs.

To address the abovementioned challenges, the present disclosure provides examples methods of forming a second isolation structure between adjacent groups of S/D regions on the same fin base of a GAA FET that can prevent or minimize current leakage between the electrically isolated groups of S/D regions on the same fin base. In some embodiments, the second isolation structure can be formed by replacing a portion of a fin base with a dielectric material. The portion of the fin base can be disposed between a pair of STI regions and is non-overlapping with S/D regions disposed on other portions of the fin base. The replacement of the portion of the fin base can include forming an isolation trench between the pair of STI regions by plasma etching the portion of the fin base. By controlling the plasma etching process parameters (e.g., etching gas type, etching gas flow rate, etching chamber pressure, bias power, etc.), the profile of the isolation trench can be controlled to ensure adequate removal of the portion of the fin base. In some embodiments, the cross-sectional profile of the isolation trench can have widths that gradually increase along the height of the STI regions and gradually decrease below the bottom surfaces of the STI regions. Such cross-sectional profile of the isolation trench can ensure substantially complete removal of the portion of the fin base from the sidewalls and bottom edges of the STI regions. As a result, current leakage between the S/D regions on the fin base through any residue material of the etched portion of the fin base can be prevented or minimized, and the device performance and reliability of the GAA FET can be improved.

FIG. 1A illustrates an isometric view of a FET 100 (also referred to as a "GAA FET 100"), according to some embodiments. FIG. 1B illustrates a top-down view of FET 100, according to some embodiments. FIGS. 1C, 1E, 1G, and 1I illustrate different cross-sectional views of FET 100 along lines A-A of FIGS. 1A and 1B, according to some embodiments. FIGS. 1D, 1F, 1H, and 1J illustrate different cross-sectional views of FET 100, along lines B-B of FIGS. 1A and 1B, according to some embodiments. FIGS. 1C, 1D, 1E, 1F, 1G, 1H, 1I, and 1J illustrate cross-sectional views of FET 100 with additional structures that are not shown in FIGS. 1A and 1B for simplicity. The discussion of elements with the same annotations applies to each other, unless mentioned otherwise.

Referring to FIGS. 1A-1J, in some embodiments, FET 100 can include (i) a substrate 104, (ii) fin bases 106A-106D disposed on substrate 104, (iii) STI regions 108A-108E disposed on substrate 104, (iv) S/D regions 110A1-110D4 disposed on fin bases 106A-106D, (v) gate structures 112A-112F, (vi) outer gate spacers 114, (vii) inner gate spacers 115, (viii) first isolation structures 116A-116E disposed on STI structures 108A-108E, respectively, (ix) barrier layers 118A-118E disposed on first isolation structures 116A-116E, respectively, (x) a second isolation structure 119 disposed on substrate 104; (xi) etch stop layers (ESLs) 120, (xii) interlayer dielectric (ILD) layers 122, (xiii) nanostructured channel regions 124A-124D disposed on fin bases 106A-106D, respectively, (nanostructured channel regions 124C not visible in views of FIGS. 1A-1J, visible in view of FIG. 9C); and (xiv) hard mask (HM) layers 125 disposed on ILD layers 122. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm. In some embodiments, nanostructured channel regions 124A-124D can be in the form of nanosheets, nanowires, nanorods, nanotubes, or other suitable nanostructured shapes.

In some embodiments, substrate 104 can be a semiconductor material, such as silicon, germanium (Ge), silicon germanium (SiGe), a silicon-on-insulator (SOI) structure, and a combination thereof. Further, substrate 104 can be doped with p-type dopants (e.g., boron, indium, aluminum, or gallium) or n-type dopants (e.g., phosphorus or arsenic).

Figures 1C, 1D:
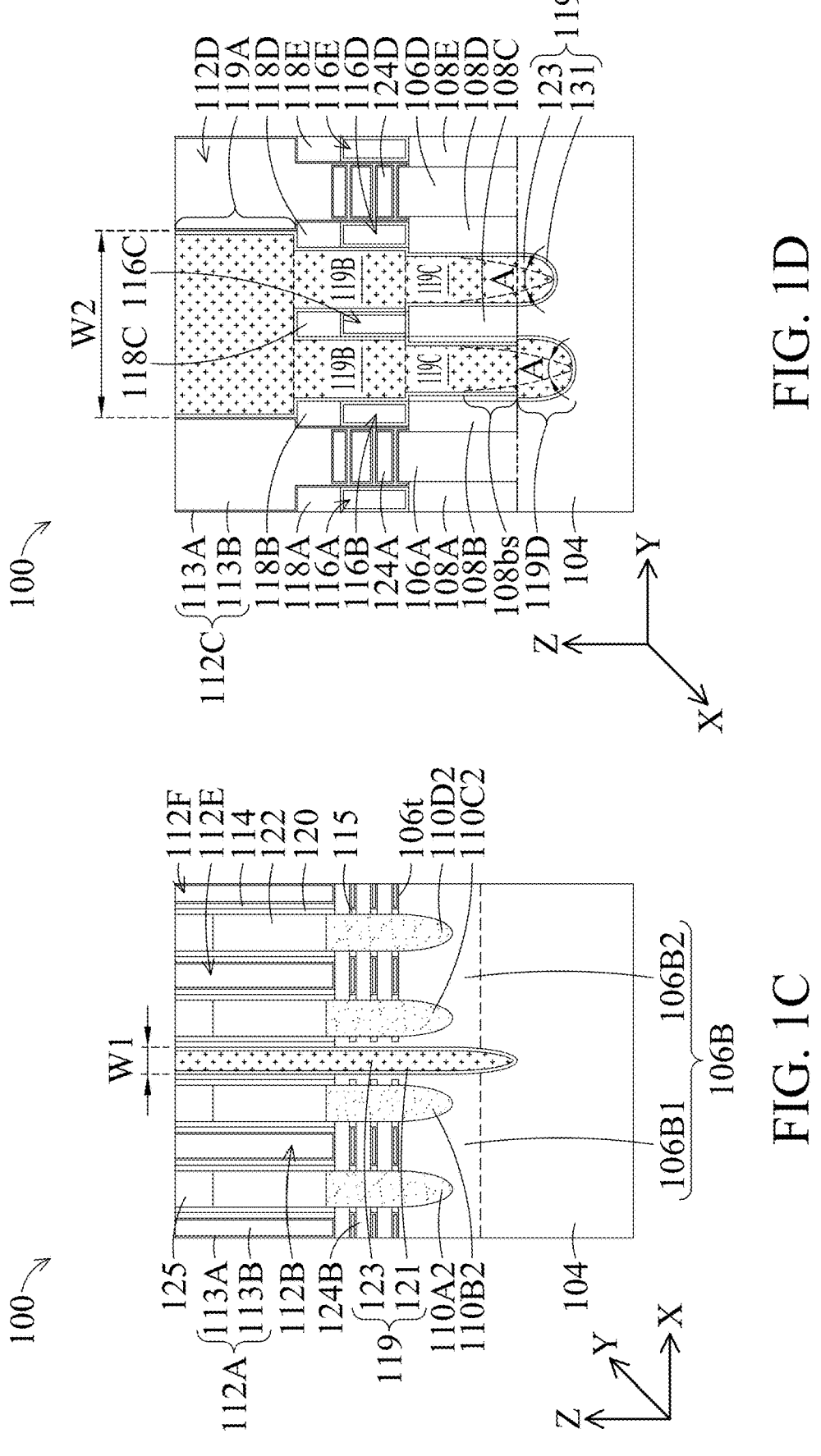
FIGS. 1C-1J illustrate different cross-sectional views of a semiconductor device with an isolation structure, in accordance with some embodiments.

In some embodiments, fin bases 106A-106D can include a material similar to substrate 104. Fin bases 106A-106D can have elongated sides extending along an X-axis. FIG. 1B illustrates that (i) fin base 106A can extend substantially parallel to and between STI regions 108A and 108B and can extend under gate structures 112A, 112B, 112C, 112E, and 112F and S/D regions 110A1-110D1; and (ii) fin base 106D can extend substantially parallel to and between STI regions 108D and 108E and can extend under gate structures 112A, 112B, 112D, 112E, and 112F and S/D regions 110A4-110D4. FIGS. 1B, 1C, 1E, 1G, and 1I illustrate that fin base 106B can include fin base portions 106B1 and 106B2, which are separated and electrically isolated from each other by second isolation structure 119. In some embodiments, fin base portion 106B1 can extend substantially parallel to and between STI regions 108B and 108C and can extend under gate structures 112A and 112B and S/D regions 110A2 and 110B2, as shown in FIGS. 1B and 1C. In some embodiments, fin base portion 106B2 can extend substantially parallel to and between STI regions 108B and 108C and can extend under gate structures 112E and 112F and S/D regions 110C2 and 110D2, as shown in FIGS. 1B and 1C. Similar to fin base 106B, fin base 106C can include fin base portions 106C1 and 106C2, which are separated and electrically isolated from each other by second isolation structure 119, as shown in FIG. 1B. In some embodiments, fin base portion 106C1 can extend substantially parallel to and between STI regions 108C and 108D and can extend under gate structures 112A and 112B and S/D regions 110A3 and 110B3, as shown in FIG. 1B. In some embodiments, fin base portion 106C2 can extend substantially parallel to and between STI regions 108C and 108D and can extend under gate structures 112E and 112F and S/D regions 110C3 and 110D3, as shown in FIG. 1B.

Referring to FIGS. 1A-1J, in some embodiments, STI regions 108A-108E, outer gate spacers 114, inner gate spacers 115, ESLs 120, ILD layers 122, and HM layers 125 can include an insulating material, such as silicon oxide ($SiO_2$), silicon nitride (SiN), silicon oxynitride (SiON), silicon carbon nitride (SiCN), silicon oxycarbon nitride (SiOCN), and silicon germanium oxide. Outer gate spacers 114, barrier layers 118A-118E, ESLs 120, ILD layers 122, and HM layers 125 are not shown in FIG. 1B for simplicity.

In some embodiments, S/D regions 110A1-110D4 can include an epitaxially-grown semiconductor material, such as Si, and n-type dopants, such as phosphorus and other suitable n-type dopants. In some embodiments, S/D regions 110A1-110D4 can include an epitaxially-grown semiconductor material, such as Si and SiGe, and p-type dopants, such as boron and other suitable p-type dopants.

In some embodiments, nanostructured channel regions 124A-124D can include semiconductor materials similar to or different from substrate 104. In some embodiments, nanostructured channel regions 124A-124D can include Si, SiAs, silicon phosphide (SiP), SiC, SiCP, SiGe, Silicon Germanium Boron (SiGeB), Germanium Boron (GeB), Silicon-Germanium-Tin-Boron (SiGeSnB), a III-V semiconductor compound, or other suitable semiconductor materials. Though rectangular cross-sections of nanostructured channel regions 124A-124D are shown, nanostructured channel regions 124A-124D can have cross-sections of other geometric shapes (e.g., circular, elliptical, triangular, or polygonal).

In some embodiments, each of gate structures 112A, 112B, 112E, and 112F can surround each of nanostructured channel regions 124A, 124B, 124C, and 124D. In some embodiments, gate structure 112C can surround nanostructured channel regions 124A and gate structure 112D can surround nanostructured channel regions 124D. In some embodiments, gate structures 112C and 112D can be separated and electrically isolated from each other by second isolation structure 119. Gate structures 112A-112F can be electrically isolated from adjacent S/D regions 110A1-110D4 by outer gate spacers 114 and inner gate spacers 115. In some embodiments, FET 100 can be a finFET and can have fin regions (not shown) instead of nanostructured channel regions 124A-124D.

In some embodiments, each gate structure 112A-112F can include (i) an interfacial oxide (IL) layer (not shown), (ii) a high-k (HK) gate dielectric layer 113A disposed on the IL layer, and (iii) a conductive layer 113B disposed on HK gate dielectric layer 113A. In some embodiments, IL layers can include $SiO_2$, silicon germanium oxide ($SiGcO_x$), or germanium oxide ($GeO_x$). In some embodiments, HK gate dielectric layers 113A can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). In some embodiments, conductive layers 113B can be a multi-layered structure. The different layers of conductive layer 113B are not shown for simplicity. Each of conductive layer 113B can include a work function metal (WFM) layer disposed on HK gate dielectric layer 113A and a gate metal fill layer disposed on the WFM layer. In some embodiments, the WFM layer can include titanium aluminum (TiAl), titanium aluminum carbide (TiAlC), tantalum aluminum (TaAl), tantalum aluminum carbide (TaAlC), Al-doped Ti, Al-doped TIN, Al-doped Ta, Al-doped TaN, or other suitable Al-based materials for GAA NFET 100. In some embodiments, the WFM layer can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, and tantalum copper (Ta—Cu) for GAA PFET 100. The gate metal fill layers can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

In some embodiments, first isolation structures 116A-116E can electrically isolate (i) S/D regions 110A1-110A4 from each other along a Y-axis, (ii) S/D regions 110B1-110B4 from each other along a Y-axis, (iii) S/D regions 110C1-110C4 from each other along a Y-axis, and (iv) S/D regions 110D1-110D4 from each other along a Y-axis, as shown in FIG. 1B. Furthermore, first isolation structures 116A-116E can prevent the merging of epitaxially-grown semiconductor materials of (i) S/D regions 110A1-110A4 along a Y-axis, (ii) S/D regions 110B1-110B4 along a Y-axis, (iii) S/D regions 110C1-110C4 along a Y-axis, and (iv) S/D regions 110D1-110D4 along a Y-axis. In some embodiments, first isolation structure 116A can have elongated sides extending along an X-axis and under gate structures 112A, 112B, 112C, 112E, and 112F. In some embodiments, first isolation structure 116B can have elongated sides extending along an X-axis and under gate structures 112A, 112B, 112C, 112E, and 112F and second isolation structure 119. In some embodiments, first isolation structure 116C can have elongated sides extending along an X-axis and under gate structures 112A, 112B, 112E, and 112F and second isolation structure 119. In some embodiments, first isolation structure 116D can have elongated sides extending along an X-axis and under gate structures 112A, 112B, 112D, 112E, and 112F and second isolation structure 119. In some embodiments, first isolation structure 116A can have elongated sides extending along an X-axis and under gate structures 112A, 112B, 112D, 112E, and 112F. In some embodiments, each of first isolation structures 116A-116E can include an insulating liner 117A and an insulating fill layer 117B. In some embodiments, insulating liner 117A and insulating fill layer 117B can include $SiO_2$, SiN, SiCN, SiOCN, or $SiGeO_x$.

In some embodiments, barrier layers 118A-118E can prevent first isolation structures 116A-116E from etching during the formation of S/D regions 110A1-110D4, as described in detail below. In some embodiments, barrier layers 118A-118E can include a rare earth metal oxide layer with a rare earth metal, such as hafnium (Hf), lanthanum (La), indium (In), rhodium (Rh), palladium (Pd), cerium (Ce), prascodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and a combination thereof. The concentration of the rare earth metal atoms in the rare earth metal oxide layer can range from about $1 \times 10^{20}$ atoms/cm$^3$ to about $3 \times 10^{22}$ atoms/cm$^3$. If the concentration is lower than about $1 \times 10^{20}$ atoms/cm$^3$, barrier layers 118 may not adequately protect first isolation structures 116A-116E from etching during the formation of S/D regions 110A1-110A4. On the other hand, the device manufacturing cost increases if the concentration is higher than about $3 \times 10^{22}$ atoms/cm$^3$.

In some embodiments, second isolation structure 119 can include an insulating liner 121 and an insulating fill layer 123. In some embodiments, insulating liner 121 can include an oxide material, such as $SiO_2$, $SiGeO_x$, and other suitable insulating oxide materials. In some embodiments, insulating fill layer 123 can include a nitride material, such as SiN, SiCN, SiOCN, and other suitable insulating nitride material. Though second isolation structure 119 is shown to be disposed between fin bases 106B1 and 106B2 and between fin bases 106C1 and 106C2, second isolation structure 119 can be disposed between fin bases 106B1 and 106B2 or between fin bases 106C1 and 106C2, according to some embodiments. In some embodiments, second isolation structure 119 can also extend through fin bases 106A and/or 106D and separate them into two portions similar to fin bases 106B and 106C. In some embodiments, second isolation structure 119 can be disposed between and in direct contact with gate structures 112C and 112D. In some embodiments, the elongated sides of second isolation structure 119 can extend along a Y-axis and be substantially parallel to the elongates sides of gate structures 112A, 112B, 112E, and 112F, as shown in FIG. 1B.

In some embodiments, top surface of second isolation structure 119 can be substantially coplanar with top surfaces of gate structures 112C and 112D and/or top surfaces of HM layers 125. The top surface of second isolation structure 119 and/or the widest portion of second isolation structure 119 can have a width W1 along an X-axis and a width W2 along a Y-axis, which is greater than width W1. In some embodiments, width W1 can be substantially equal to gate length GL1 of gate structure 112C and/or gate length GL2 of gate structure 112D. In some embodiments, width W2 can be equal to or greater than two fin pitches and less than three fin pitches, as shown in FIG. 1B. The fin pitch is defined as a sum of a distance along a Y-axis between adjacent fin bases (e.g., fin bases 106B1 and 106C1) and a fin width along a Y-axis of one of the adjacent fin bases (e.g., fin base 106B1). In some embodiments, width W2 can be equal to or greater than one fin pitch and less than two fin pitches (not shown). Within these widths W1 and W2, second isolation structure can provide adequate electrical isolation between S/D regions without compromising the device manufacturing cost.

Second isolation structure 119 can extend below bottom surfaces of STI regions 108A-108E and into substrate 104, as shown in FIGS. 1C-1J. As discussed in detail below, second isolation structure 119 is formed to have bottom portions with non-triangular cross-section profiles along a YZ-plane and to have bottom tip ends with obtuse angles to prevent or minimize current leakage between S/D regions 110B2 and 110C2 and between 110B3 and 110C3. If second isolation structure 119 has bottom portions with triangular profiles (as shown with dotted lines in FIG. 1D) along a YZ-plane and bottom tip ends with acute angles A, residue semiconductor material of fin bases 106B and 106C can remain along bottom sidewalls 108bs of STI regions 108B, 108C, and 108D during the fabrication of second isolation structure 119, which is described in detail below. The residue semiconductor material can form current leakage paths between S/D regions 110B2 and 110C2 and between 110B3 and 110C3 and degrade the performance and reliability of FET 100.

The cross-sectional profiles of second isolation structure 119 along an XZ-plane and along a YZ-plane can be different from each other. In some embodiments, second isolation structure 119 can have a cross-sectional profile along an XZ-plane as shown in FIG. 1C, 1E, 1G or 1I, and a cross-sectional profile along a YZ-plane as shown in FIG. 1D, IF, 1H or 1J.

Figures 1E, 1F:
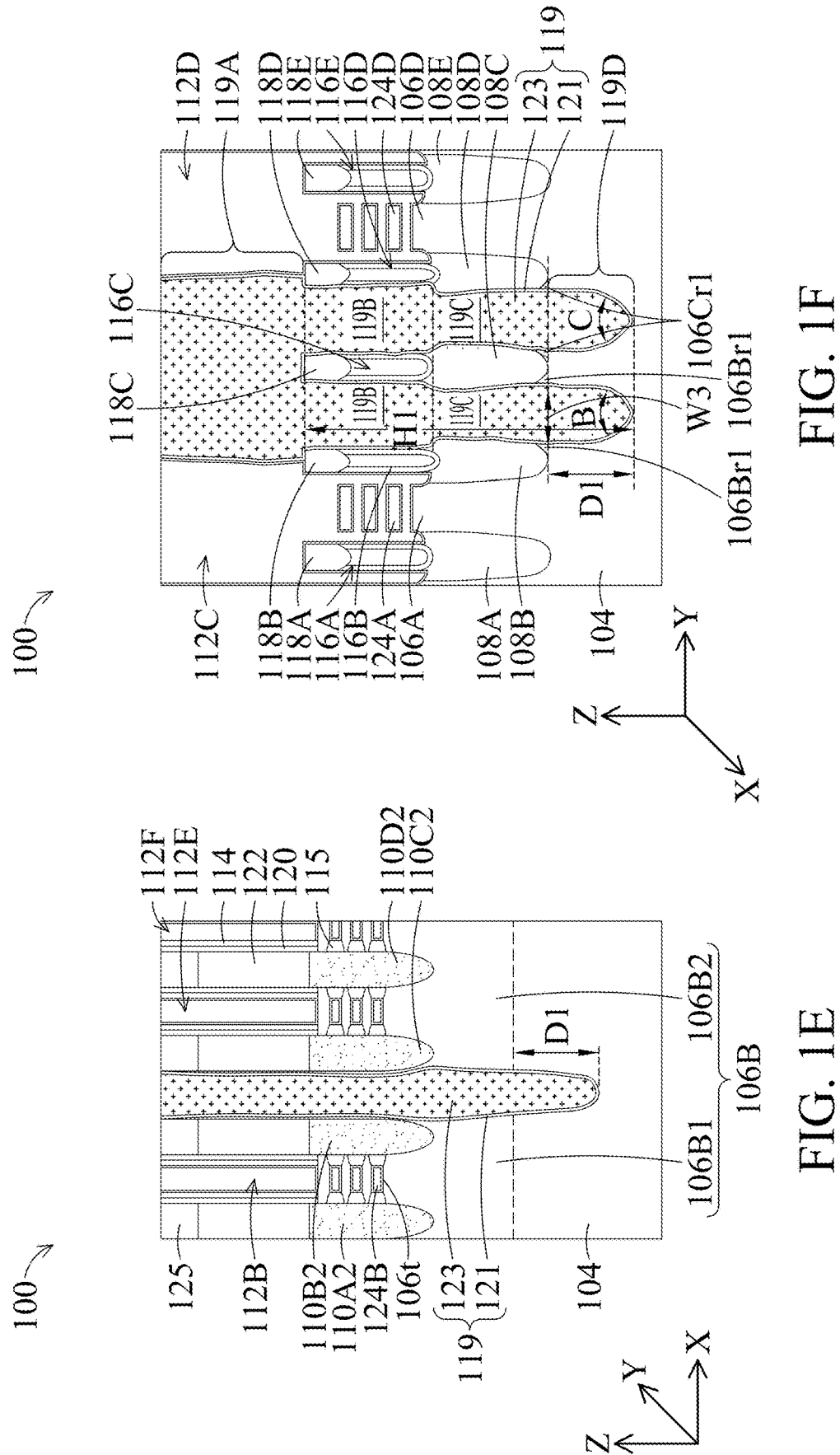
Figures 1G, 1H:
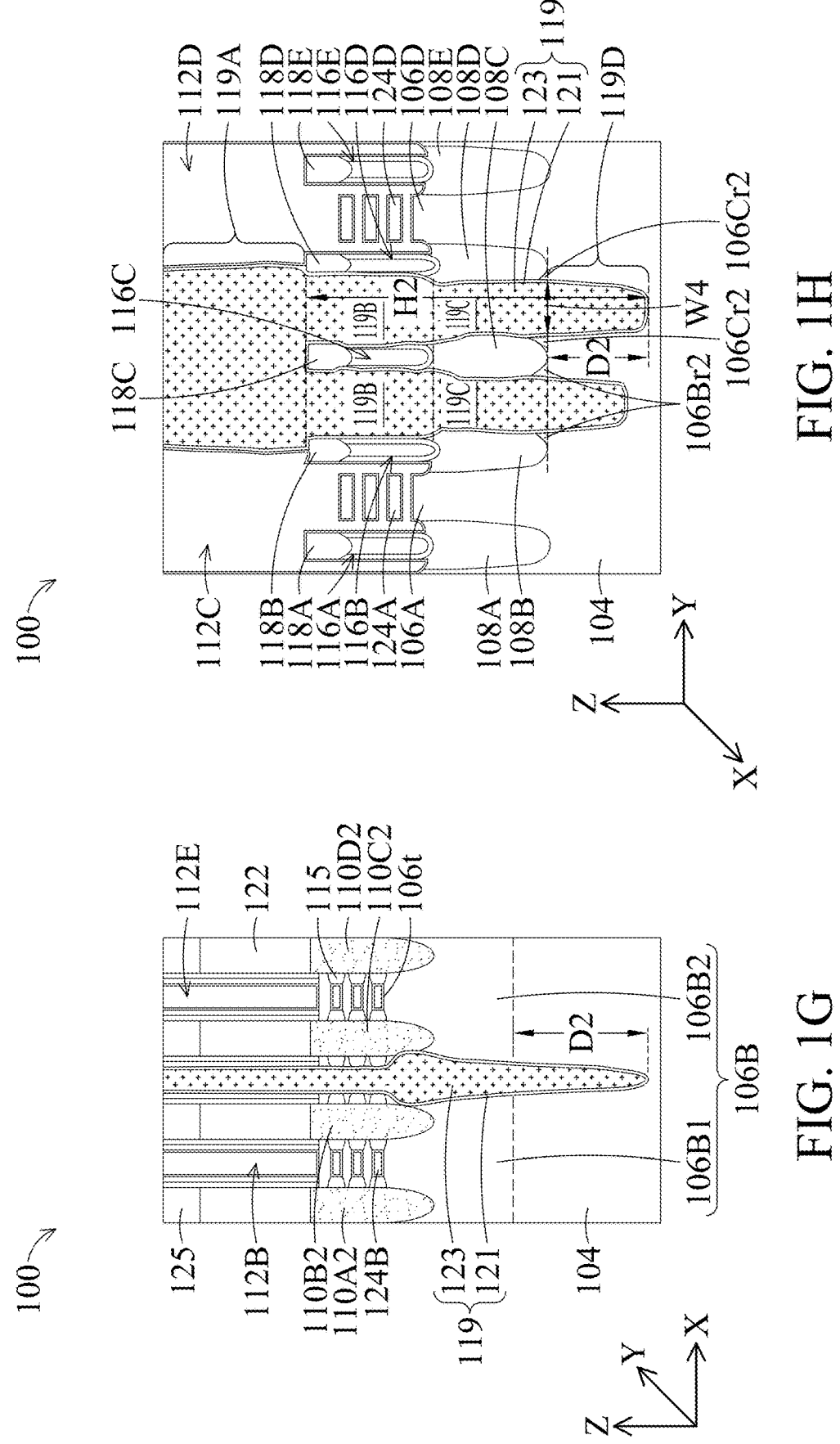
Figures 1I, 1J:
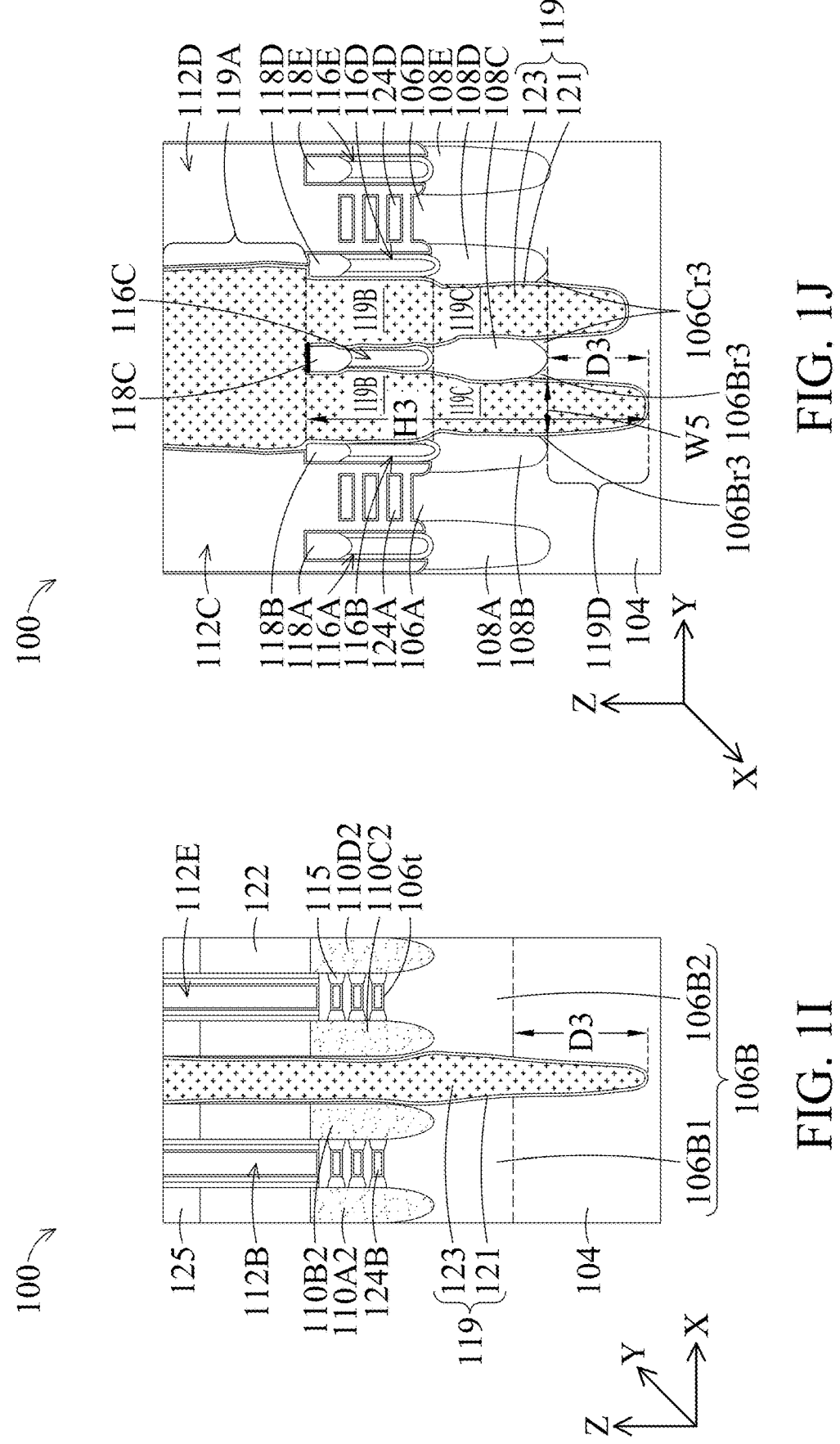

Referring to FIGS. 1C, 1E, 1G, and 1I, in some embodiments, the top portion of second isolation structure 119 above the top surfaces 106t of fin bases 106B1 and 106B2 can have a substantially linear cross-sectional profile and the bottom portion of second isolation structure 119 below the top surfaces 106t can have a tapered cross-sectional profile. In some embodiments, widths along the height of the top portion of second isolation structure 119 can be substantially equal to W1. Referring to FIGS. 1E, 1G, and 1I, in some embodiments, the widths of the bottom portion of second isolation structure 119 can gradually increase along a vertical distance of about 10 nm to about 25 nm below the top surfaces 106t and then gradually decrease along the remaining height of the bottom portion of second isolation structure 119. In some embodiments, second isolation structure 119 can extend a distance D1 of about 25 nm to about 40 nm (shown in FIG. 1E), a distance D2 of about 45 nm to about 75 nm (shown in FIG. 1G), or a distance D3 of about 25 nm to about 45 nm (shown in FIG. 1I) into substrate 104.

Referring to FIGS. 1D, IF, 1H, and 1J, in some embodiments, isolation portions 119A, 119B, 119C, and 119D of second isolation structure 119 can have cross-sectional profiles different from each other along a YZ-plane. Isolation portion 119A can be disposed on barrier layers 118B, 118C, and 118D. Isolation portions 119B can extend between top surfaces of barrier layers 118B, 118C, and 118D and top surfaces of STI regions 108B, 108C, and 108D. Isolation portions 119C can extend between top and bottom surfaces of STI regions 108B, 108C, and 108D. Isolation portions 119A, 119B, and 119C can have substantially linear cross-sectional profiles and can have different widths from each other along a Y-axis. In some embodiments, isolation portion 119A can be wider than isolation portions 119B, which can be wider than isolation portion 119C. The isolation portions 119B can be wider than isolation portions 119C to prevent void formation in isolation portions 119C and 119D during the formation of second isolation structure 119, which is described in detail below. Similarly, isolation portion 119A can be wider than isolation portions 119B to prevent void formation in isolation portions 119B during the formation of second isolation structure 119. Isolation portions 119D can extend a distance D1 of about 25 nm to about 40 nm (shown in FIG. 1F), a distance D2 of about 45 nm to about 75 nm (shown in FIG. 1H), or a distance D3 of about 25 nm to about 45 nm (shown in FIG. 1J) from bottom surfaces of STI regions 108B, 108C, and 108D into substrate 104.

Referring to FIG. 1D, in some embodiments, second isolation structure 119 can be formed with sidewalls of isolation portion 119C disposed directly on entire sidewalls of STI regions 108B, 108C, and 108D to ensure the absence of any residue semiconductor material of fin bases 106B and 106C between the sidewalls of isolation portions 119C and the sidewalls of STI regions 108B, 108C, and 108D. To further ensure the absence of any residue semiconductor material, top surfaces of isolation portions 119D can be in direct contact with bottom surfaces and/or bottom surface edges of STI regions 108B, 108C, and 108D. In some embodiments, top surfaces of isolation portions 119D can be wider than bottom surfaces of isolation portions 119C along a Y-axis and can overlap bottom surfaces of STI regions 108B, 108C, and 108D. In some embodiments, angles of bottom surfaces of isolation portions 119C are greater than 90 degrees, and as a result local maximum electric field is reduced and reliability is enhanced. In some embodiments, bottom surfaces of the of isolation portions 119C are substantially round-arc.

Referring to FIG. 1F, in some embodiments, isolation portions 119C can have tapered cross-sectional profiles when STI regions 108B, 108C, and 108D have tapered cross-sectional profiles along a YZ-plane. The tapered cross-sectional profiles of isolation portions 119C can minimize the presence of residue semiconductor materials 106Br1 and 106Cr1 of fin bases 106B and 106C, respectively, between the sidewalls of isolation portions 119C and the sidewalls of STI regions 108B, 108C, and 108D. In some embodiments, to minimize the height and/or thickness of residue semiconductor materials 106Br1 and 106Cr1 to less than about 10 nm (e.g., between about 9.5 nm to about 5 nm), isolation portions 119B, 119C, and 119D can be formed with a combined height H1 of about 180 nm to about 190 nm and isolation portions 119D can be formed with (i) a top surface width W3 of about 35 nm to about 45 nm, (ii) bottom tip ends with angles B and C of about 110 degrees to about 115 degrees, (iii) a height of about 25 nm to about 40 nm, and (iv) curved sidewall profiles. In some embodiments, angles of bottom surfaces of the isolation portions 119C are obtuse angles, and as a result local maximum electric field is reduced and reliability is enhanced.

Referring to FIG. 1H, in some embodiments, isolation portions 119C can have substantially vertical and linear sidewall profiles. In some embodiments, to minimize the height and/or thickness of residue semiconductor materials 106Br1 and 106Cr1 to less than about 13 nm (e.g., between about 12.5 nm to about 6 nm), isolation portions 119B, 119C, and 119D can be formed with a combined height H2 of about 200 nm to about 220 nm and isolation portions 119D can be formed with (i) a top surface width W4 of about 35 nm to about 40 nm, (ii) substantially planar bottom surfaces, (iii) a height of about 45 nm to about 75 nm, (iv) angles of about 95 degrees to about 97 degrees between the sidewalls and bottom surfaces of isolation portions 119D, and (v) tapered sidewall profiles.

Referring to FIG. 1J, in some embodiments, isolation portions 119C can have substantially vertical and linear sidewall profiles. In some embodiments, to minimize the height and/or thickness of residue semiconductor materials 106Br1 and 106Cr1 to less than about 12 nm (e.g., between about 11.9 nm to about 7 nm), isolation portions 119B, 119C, and 119D can be formed with a combined height H3 of about 185 nm to about 200 nm and isolation portions 119D can be formed with (i) a top surface width W5 of about 35 nm to about 40 nm, (ii) curved bottom surface profiles, (iii) a height of about 25 nm to about 45 nm, (iv) substantially vertical and linear sidewall profiles. In some embodiments, bottom surfaces of isolation portions 119C are substantially flat, and as a result local maximum electric field is reduced and reliability is enhanced.

In some embodiments, isolation structures 119 can be formed with cross-sectional profiles of FIG. 1E-1F, 1G-1H, or 1I-1J based on whether etching damages to S/D regions or depth loading effects between densely patterned device regions and sparsely patterned device regions are critical factors in FET performance. If etching damages to S/D regions are critical factors in FET performance, isolation structures 119 with cross-sectional profiles of FIGS. 1I-1J can be formed with radical-based processes to avoid intense etching of passivation layers and fin bases 106A, 106B, and 106D by ions. If depth loading effects are critical factors in FET performance, isolation structures 119 with cross-sectional profiles of FIGS. 1G-1H can be formed with an ion-oriented process to sufficiently remove etch by-products and polymer passivation. If etching damages to S/D regions and depth loading effects are both critical factors in FET performance, isolation structures 119 with cross-sectional profiles of FIGS. 1E-1F can be formed with both ions and radical etch.

FIG. 2 is a flow diagram of an example method 100 for fabricating FET 100, according to some embodiments. For illustrative purposes, the operations illustrated in FIG. 2 will be described with reference to the example fabrication process for fabricating FET 100 as illustrated in FIGS. 3A-11C, 12A-12M, and 13A-15C. FIGS. 3A-15A are isometric views of FET 100 at various stages of fabrication, according to some embodiments. FIGS. 3B-11B, 12B, 12D, 12F, 12H, 12J, 12L, and 13B-15B are cross-sectional views of FET 100 along lines A-A of FIGS. 1A and 1B at various stages of fabrication, according to some embodiments. FIGS. 3C-11C, 12C, 12E, 12G, 12I, 12K, 12M, and 13C-15C are cross-sectional views of FET 100 along lines B-B of FIGS. 1A and 1B at various stages of fabrication, according to some embodiments. Operations can be performed in a different order or not performed depending on specific applications. It should be noted that method 200 may not produce a FET 100. Accordingly, it is understood that additional processes can be provided before, during, and after method 200, and that some other processes may only be briefly described herein. Elements in FIGS. 3A-11C, 12A-12M, and 13A-15C with the same annotations as elements in FIGS. 1A-1J are described above. Some of the elements of FIGS. 1A-1J are not shown in FIGS. 3A-11C, 12A-12M, and 13A-15C for simplicity. FIGS. 3B-11B, 3C-11C, 12B-12M, 13B-15B, and 13C-15C illustrate cross-sectional views of FET 100 with additional structures that are not shown in FIGS. 3A-11C, 12A-12M, and 13A-15C for simplicity.

Figure 3A:
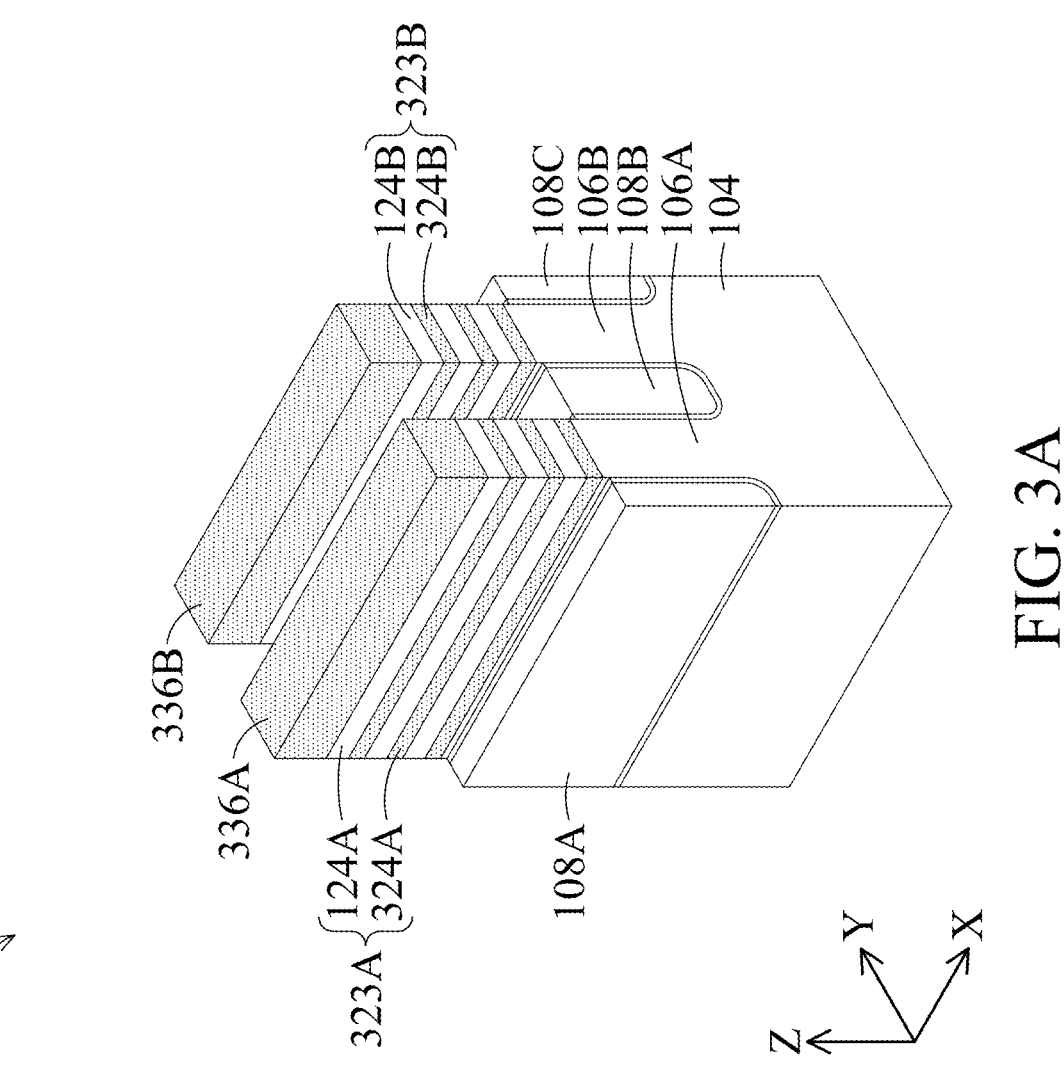
Figures 3B, 3C:
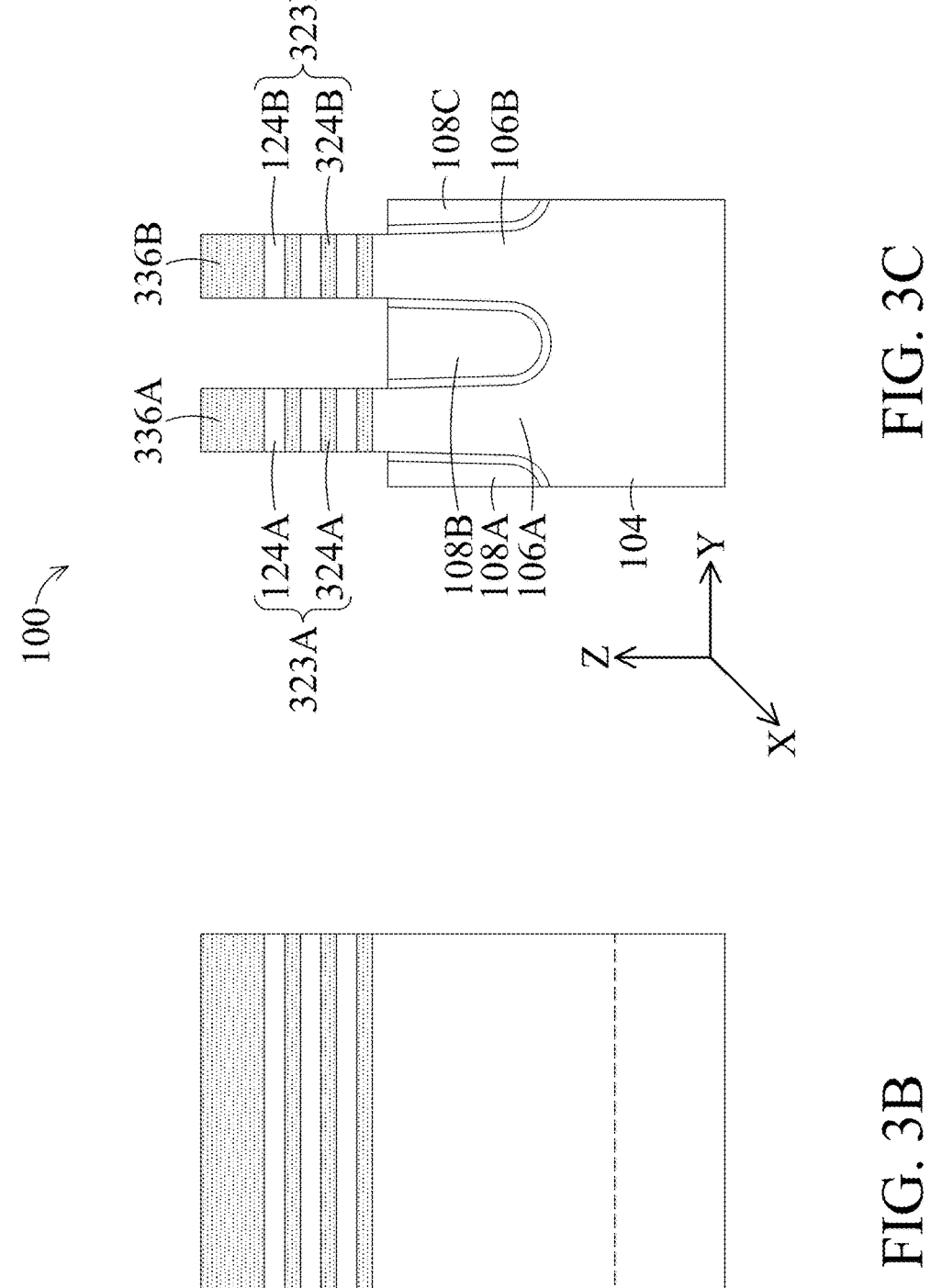
Figure 4A:
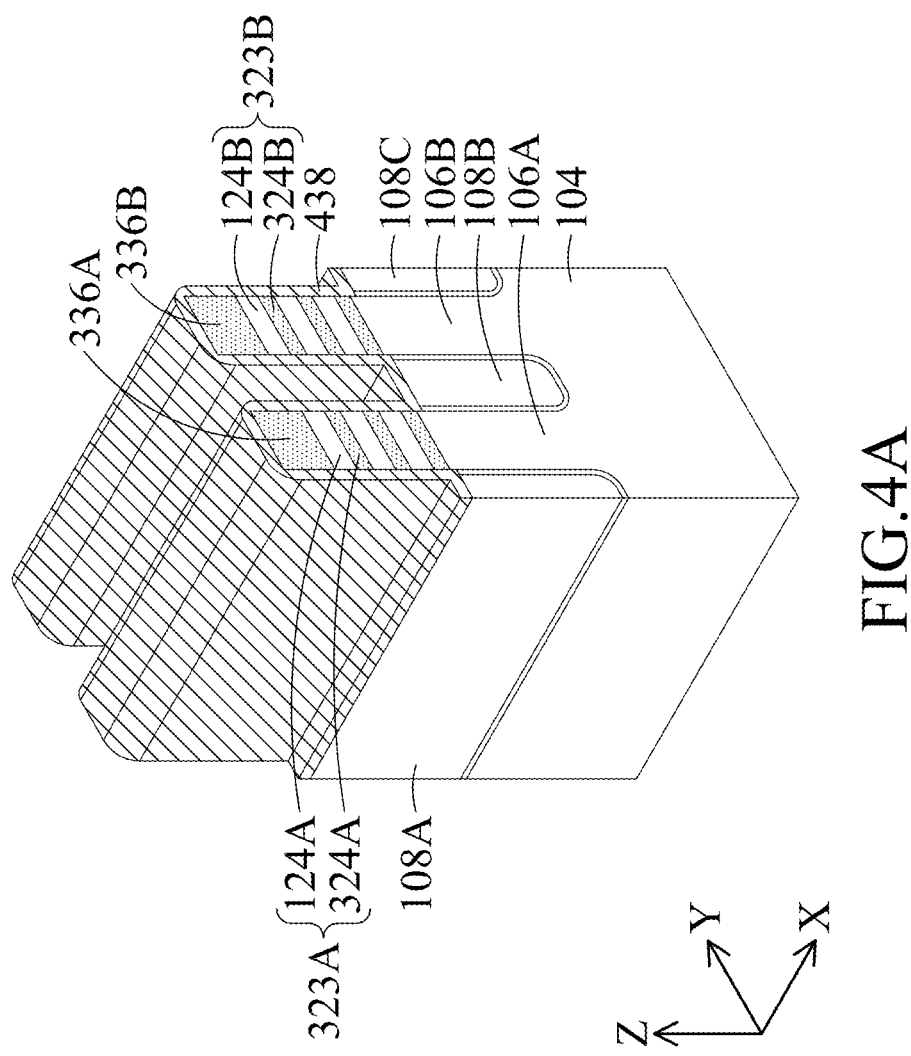
Figures 4B, 4C:
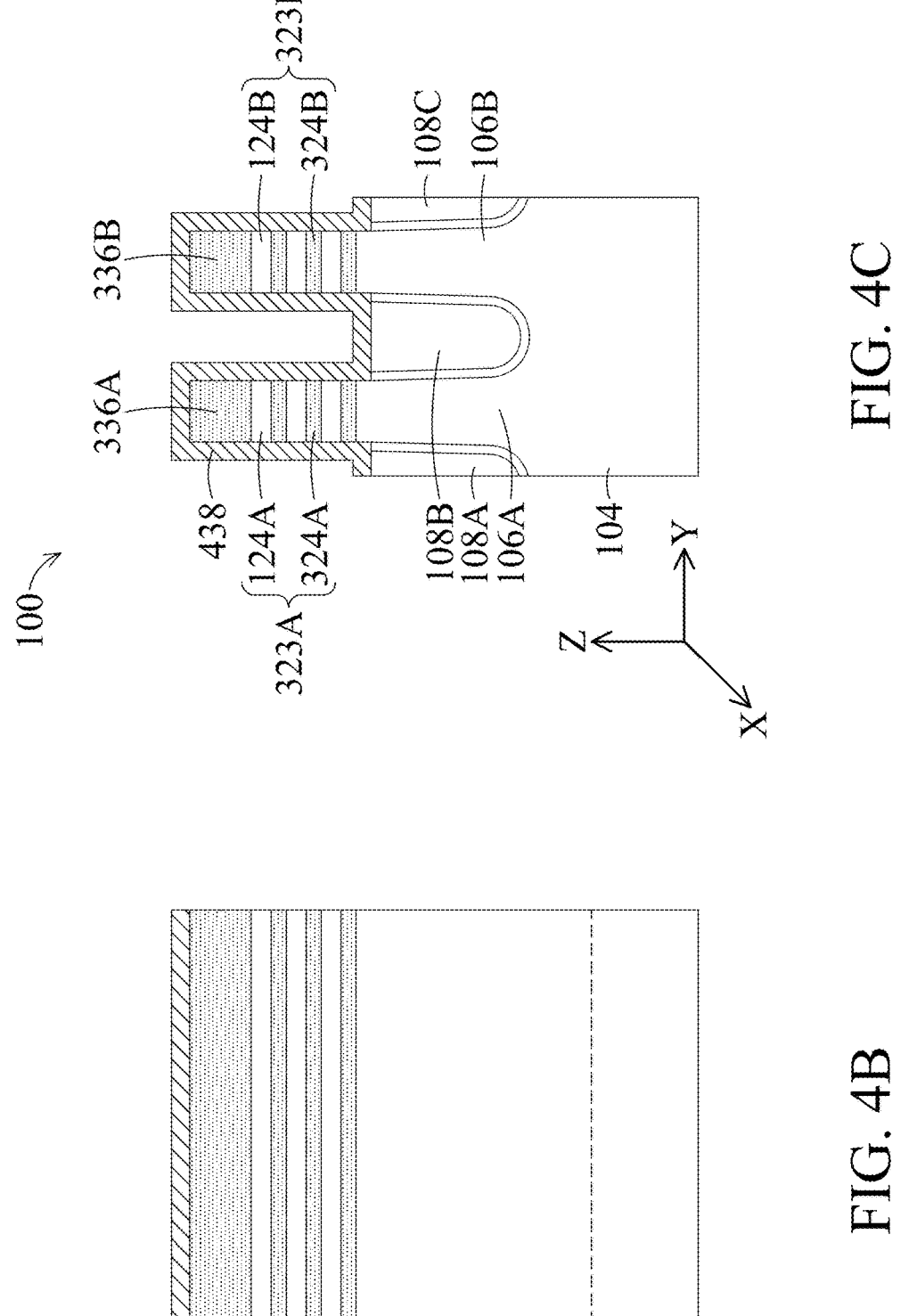
Figure 9A:
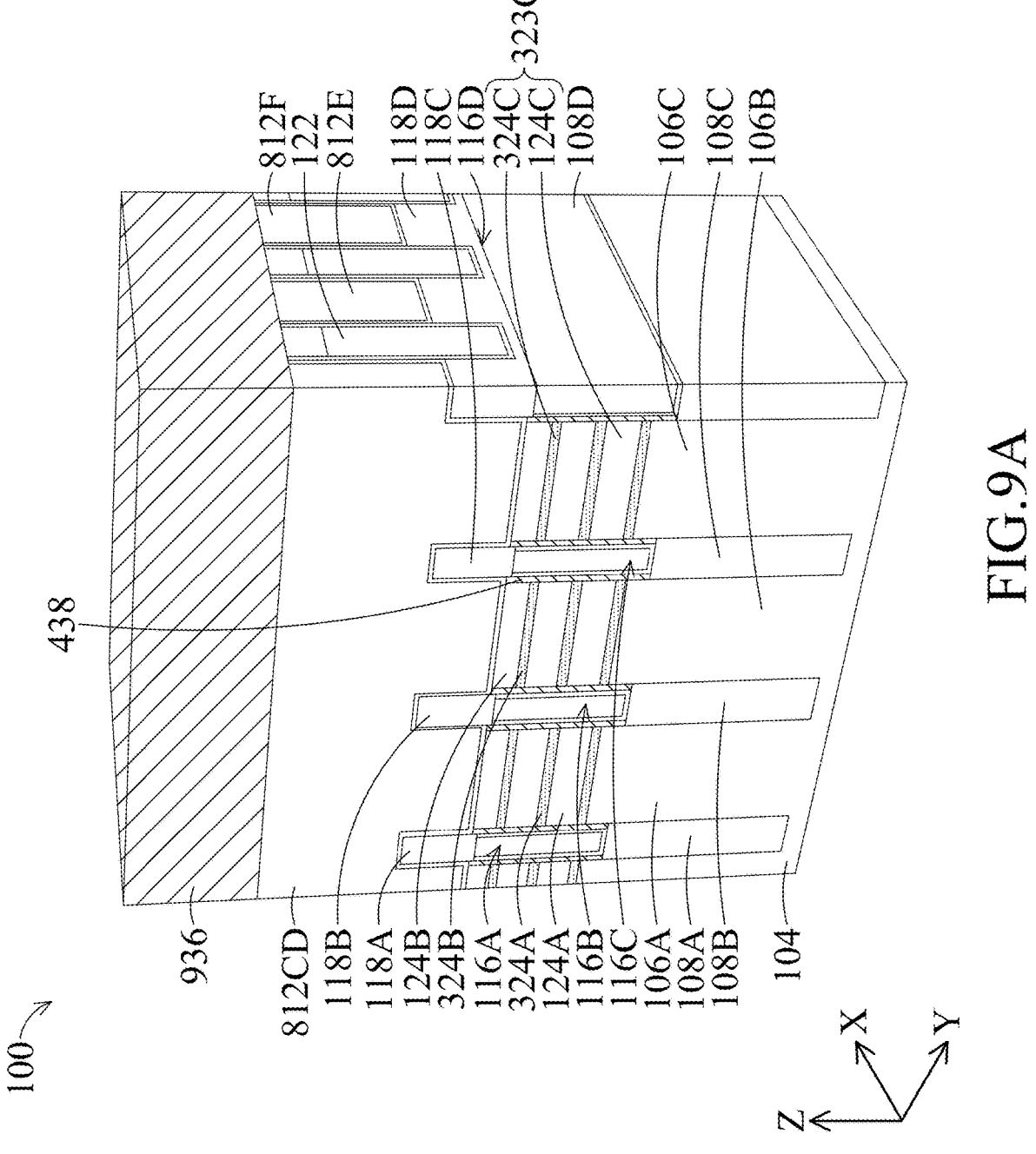
Figures 9B, 9C:
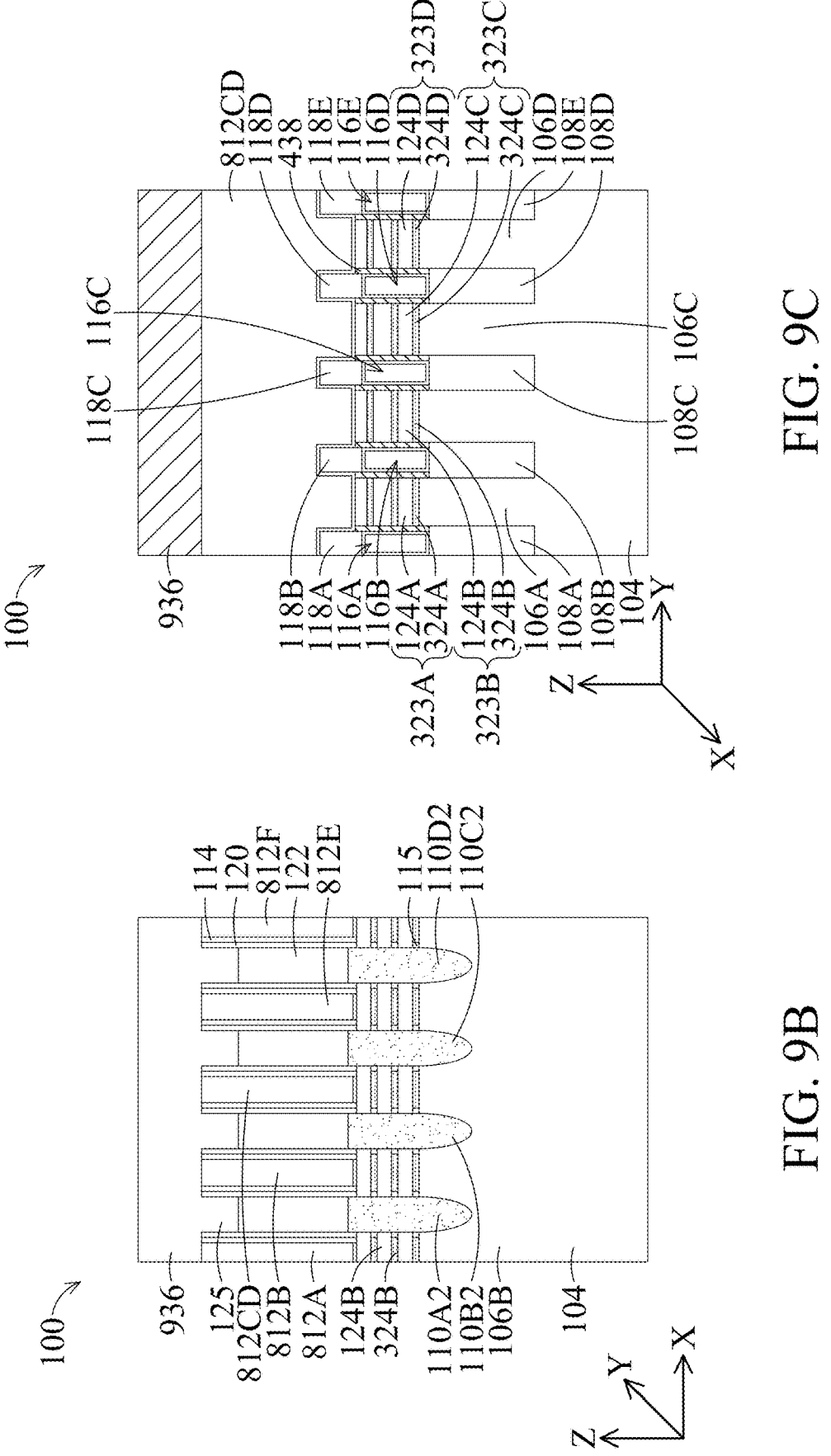

Referring to FIG. 2, in operation 205, superlattice structures are formed on fin bases on a substrate. For example, as shown in FIGS. 3A-3C, superlattice structures 323A and 324B are formed on fin bases 106A and 106B, respectively, on substrate 104. In some embodiments, superlattice structure 323A can include epitaxially-grown nanostructured layers 124A and 324A arranged in an alternating configuration and superlattice structure 324B can include epitaxially-grown nanostructured layers 124B and 324B arranged in an alternating configuration. Similarly, superlattice structures 323C with epitaxially-grown nanostructured layers 124C and 324C can be formed on fin base 106C and superlattice structures 323D with epitaxially-grown nanostructured layers 124D and 324D can be formed on fin base 106D, which are not shown in FIGS. 3A and 3C for simplicity, but are shown in FIGS. 9A and 9C. In some embodiments, nanostructured layers 124A-124D can include Si without any substantial amount of Ge (e.g., with no Ge) and nanostructured layers 324A-324D can include SiGe. Nanostructured layers 324A-324D are also referred to as sacrificial layers 324A-324D. During subsequent processing, sacrificial layers 324A-324D can be replaced in a gate replacement process to form portions of gate structures 112A-112D, respectively. In some embodiments, masking layers 336A-336B can be formed on superlattice structures 323A-323B, respectively. In some embodiments, masking layers 336A-336B can include a material similar to that of nanostructured layer 324A-324B.

Referring to FIG. 2, in operation 210, STI regions are formed on the substrate. For example, as described with reference to FIGS. 3A and 3C, STI regions 108A-108C are formed on substrate 104. Similarly, STI regions 108D-108E can be formed on substrate 104, which are not shown in FIGS. 3A and 3C for simplicity. STI regions are not visible in the cross-sectional view of FIG. 3B.

Figure 5A:
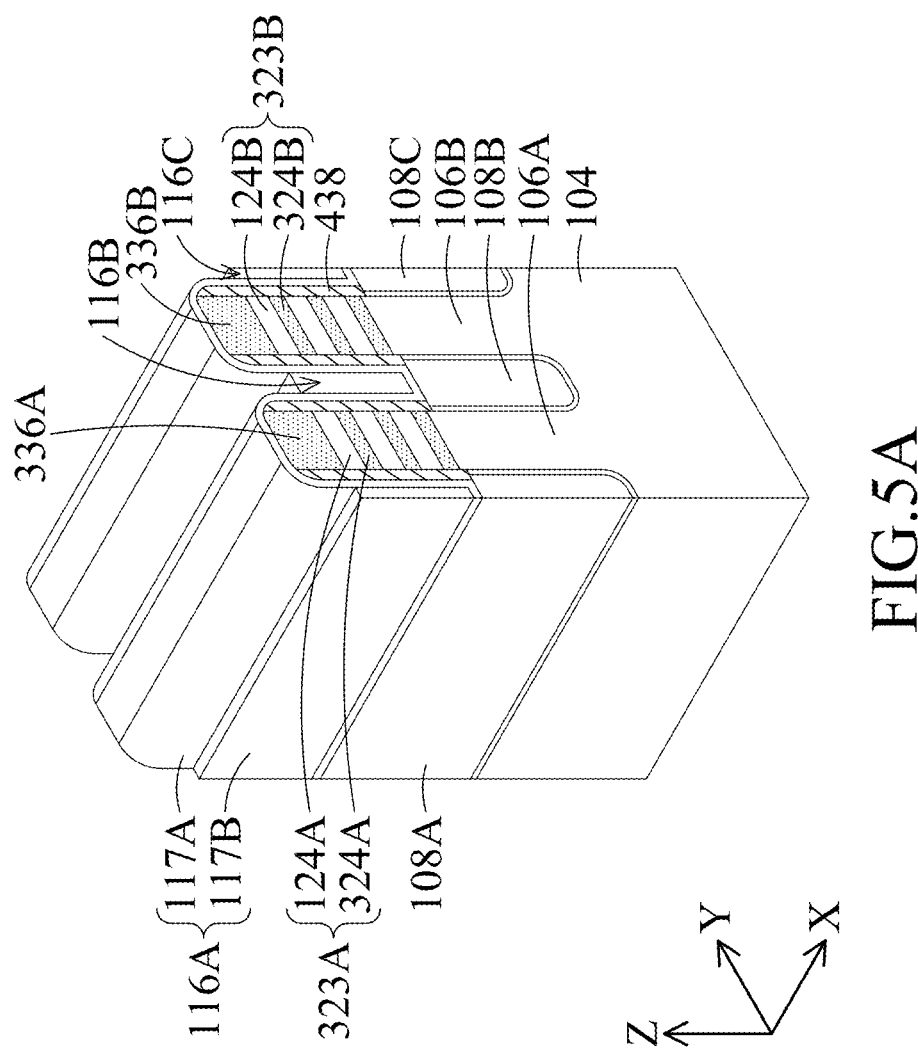
Figures 5B, 5C:
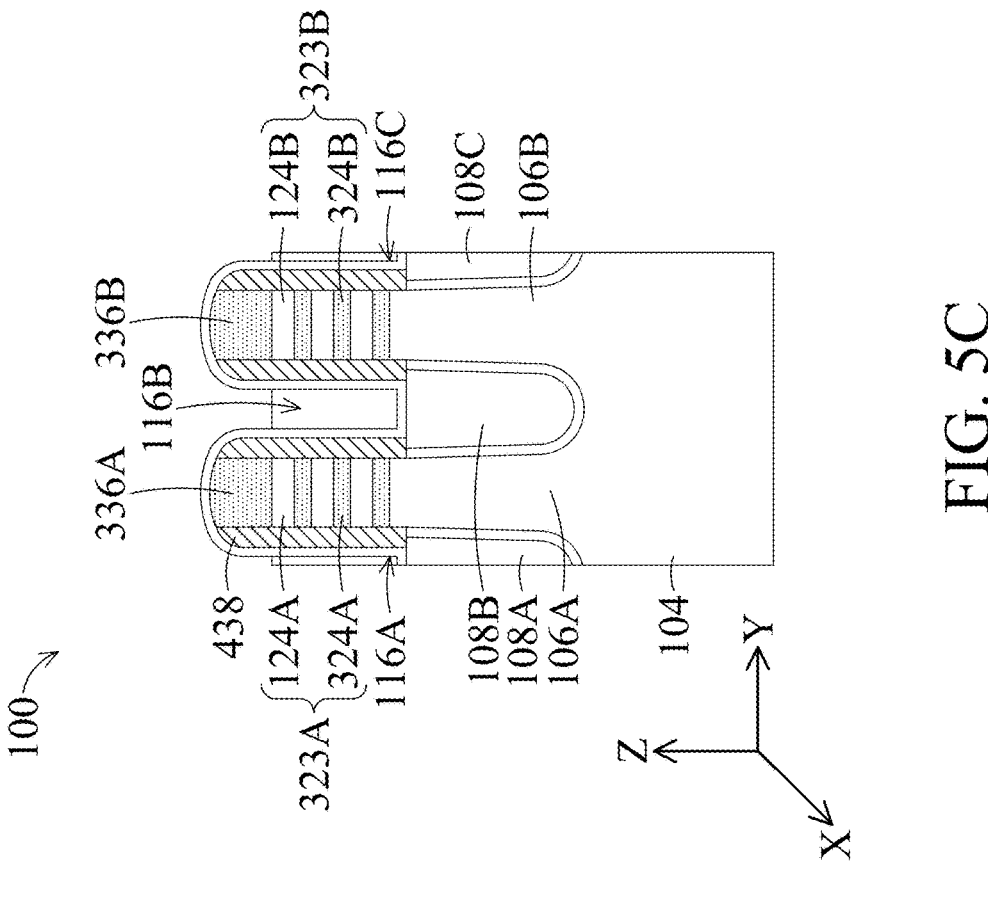

Referring to FIG. 2, in operation 215, cladding layers are formed on the superlattice structures. For example, as described with reference to FIGS. 4A-5C, cladding layers 438 are formed on sidewalls of superlattice structures 323A and 324B. Similarly, cladding layers 438 are formed on sidewalls of superlattice structures 323C and 324D. The formation of cladding layers 438 can include (i) depositing a layer of material (e.g., SiGe) similar to that of nanostructured layers 324A-324D in a CVD process with precursors, such as germane ($GeH_4$) and disilane ($Si_2H_6$) on the structures of FIGS. 3A-3C to form the structures of FIGS. 4A-4C, and (ii) performing an etch process on the deposited layer of material to form cladding layers 438 on superlattice structures 323A and 324B, as shown in FIGS. 5A and 5C.

Referring to FIG. 2, in operation 220, first isolation structures are formed on the STI regions. For example, as described with reference to FIGS. 5A-5C, first isolation structures 116A-116C are formed on STI regions 108A-108C, respectively. Similarly, first isolation structures 116D-116E (not shown in FIGS. 5A and 5C) are formed on STI regions 108D-108E, respectively. First isolation structures 116A-116C are not visible in the cross-sectional view of FIG. 5B. The formation of first isolation structures 116A-116C can include sequential operations of (i) depositing insulating liner 117A on cladding layers 438, STI regions 108A-108E, and masking layers 336A-336B, as shown in FIGS. 5A and 5C, (ii) depositing insulating fill layer 117B on insulating liner 117A, (iii) performing a chemical mechanical polishing (CMP) process on insulating liner 117A, insulating fill layer 117B, and cladding layers 438 to substantially coplanarize top surfaces of insulating liner 117A, insulating fill layer 117B, and cladding layers 438 with each other (not shown), and (iv) performing an etch process on insulating fill layer 117B to form the structures of FIGS. 5A and 5C.

Figure 6A:
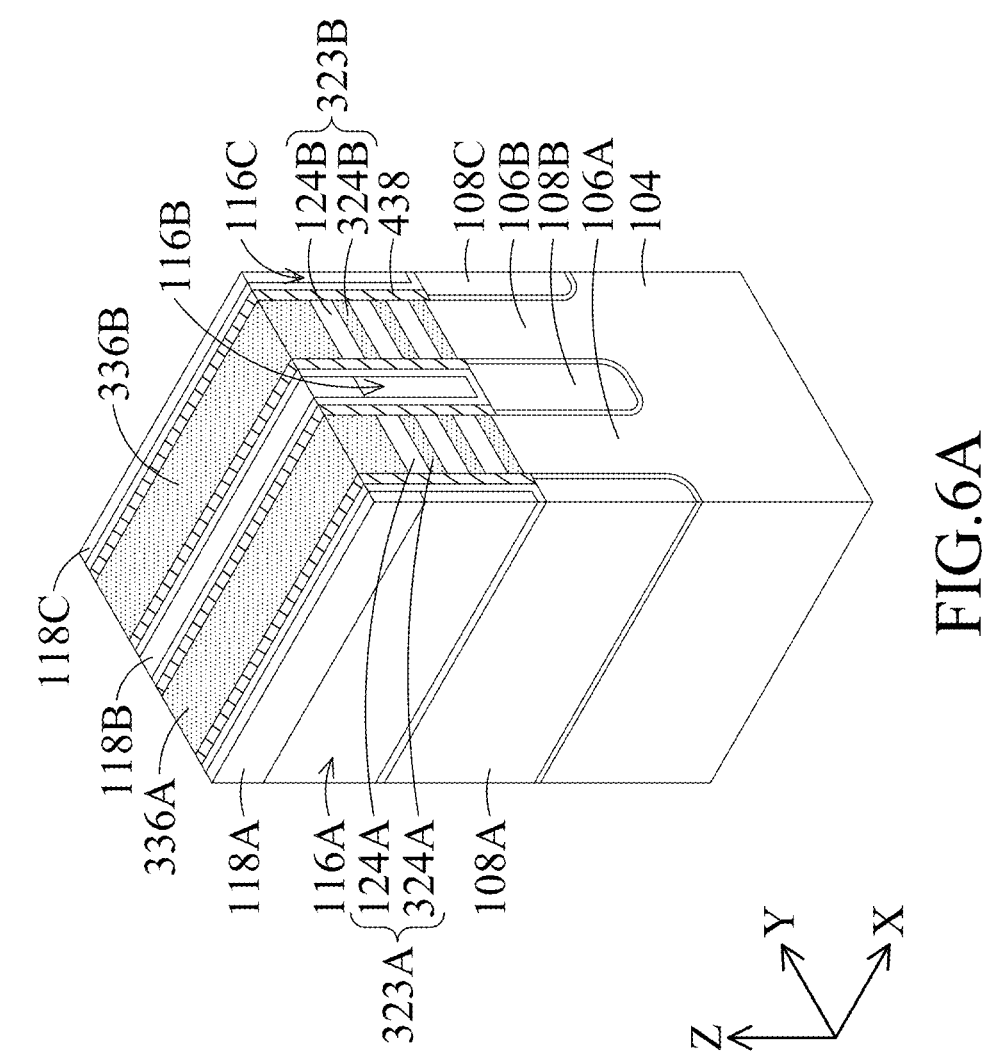
Figures 6B, 6C:
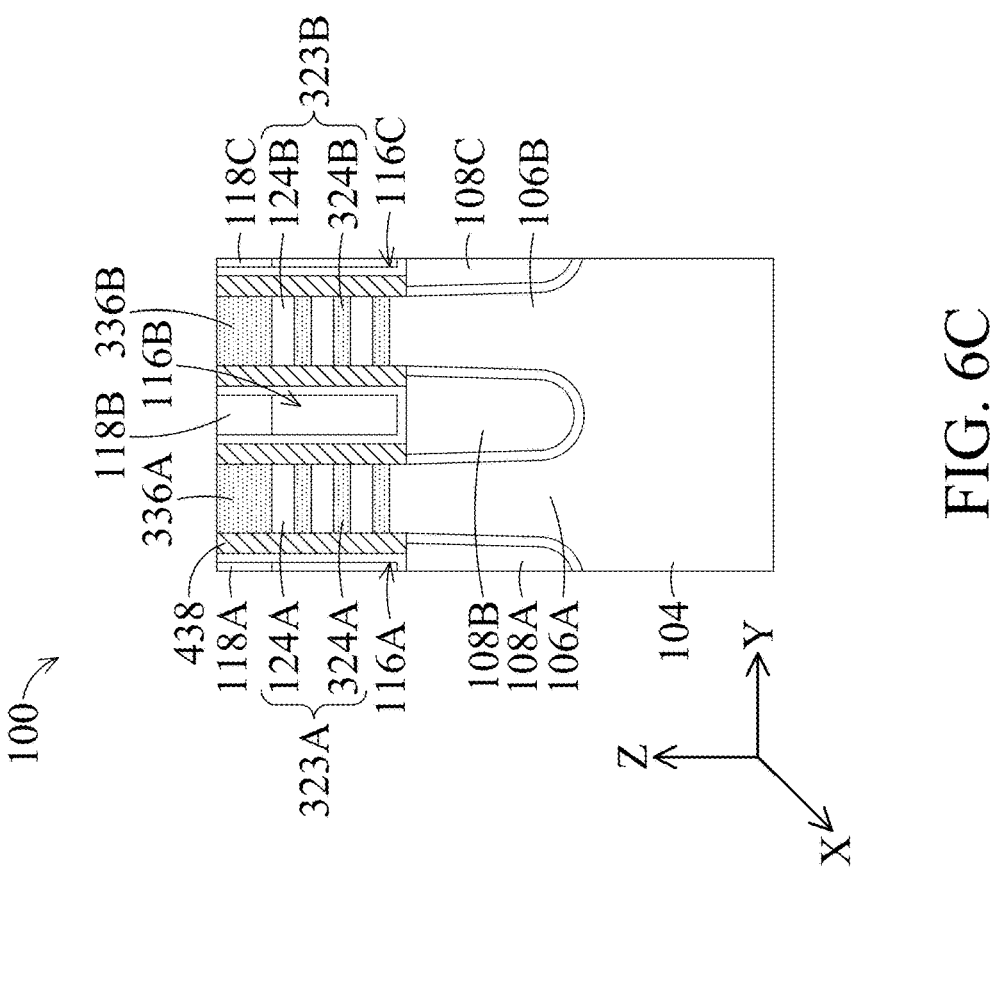

The formation of first isolation structures 116A-116C can be followed by the formation of barrier layers 118A-118C on first isolation structures 116A-116C, respectively, as shown in FIGS. 6A and 6C. Similarly, barrier layers 118D-118E (not shown in FIGS. 6A and 6C) can be formed on first isolation structures 116D-116E, respectively. Barrier layers 118A-118C are not visible in the cross-sectional view of FIG. 6B.

Figure 7A:
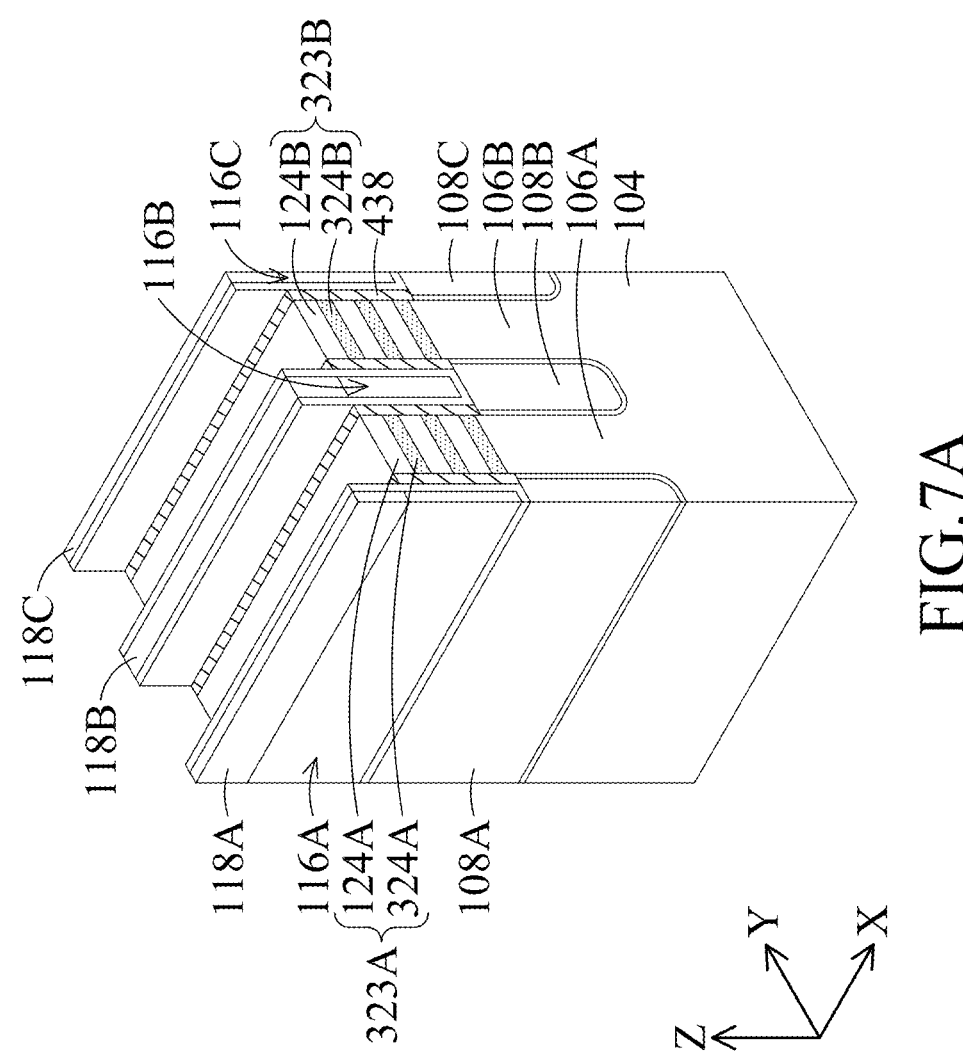
Figure 7C:
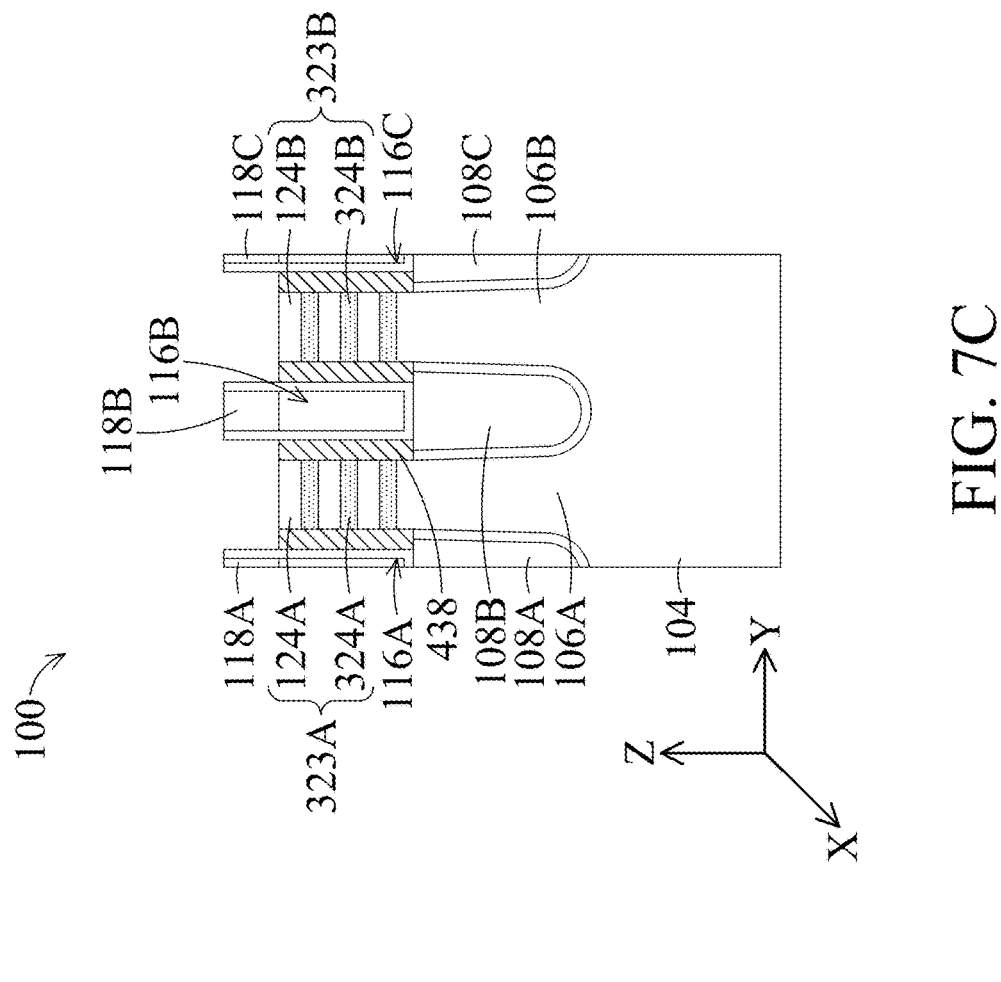
Figure 7B:
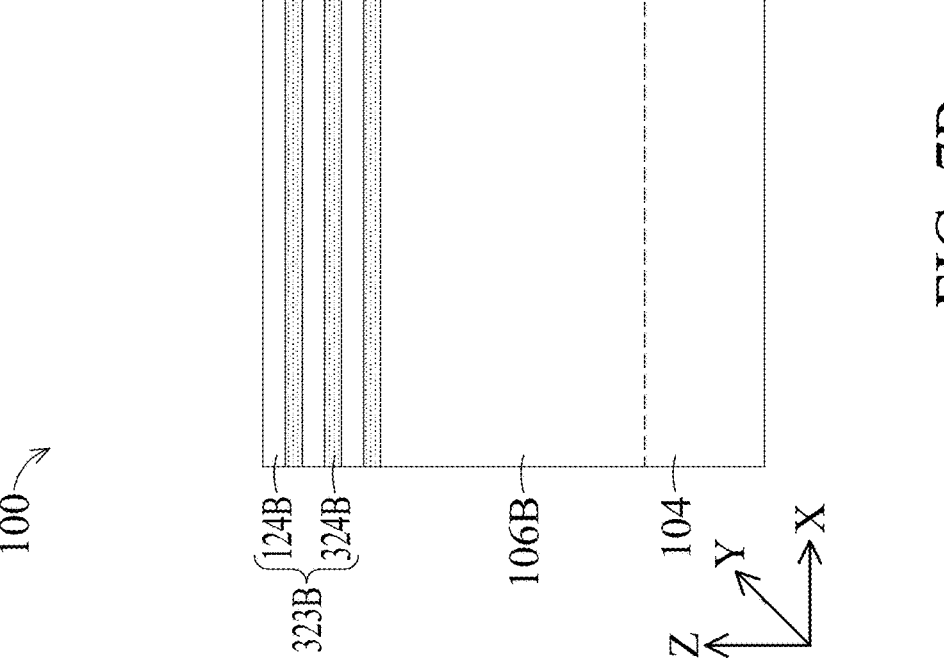
Figure 8A:
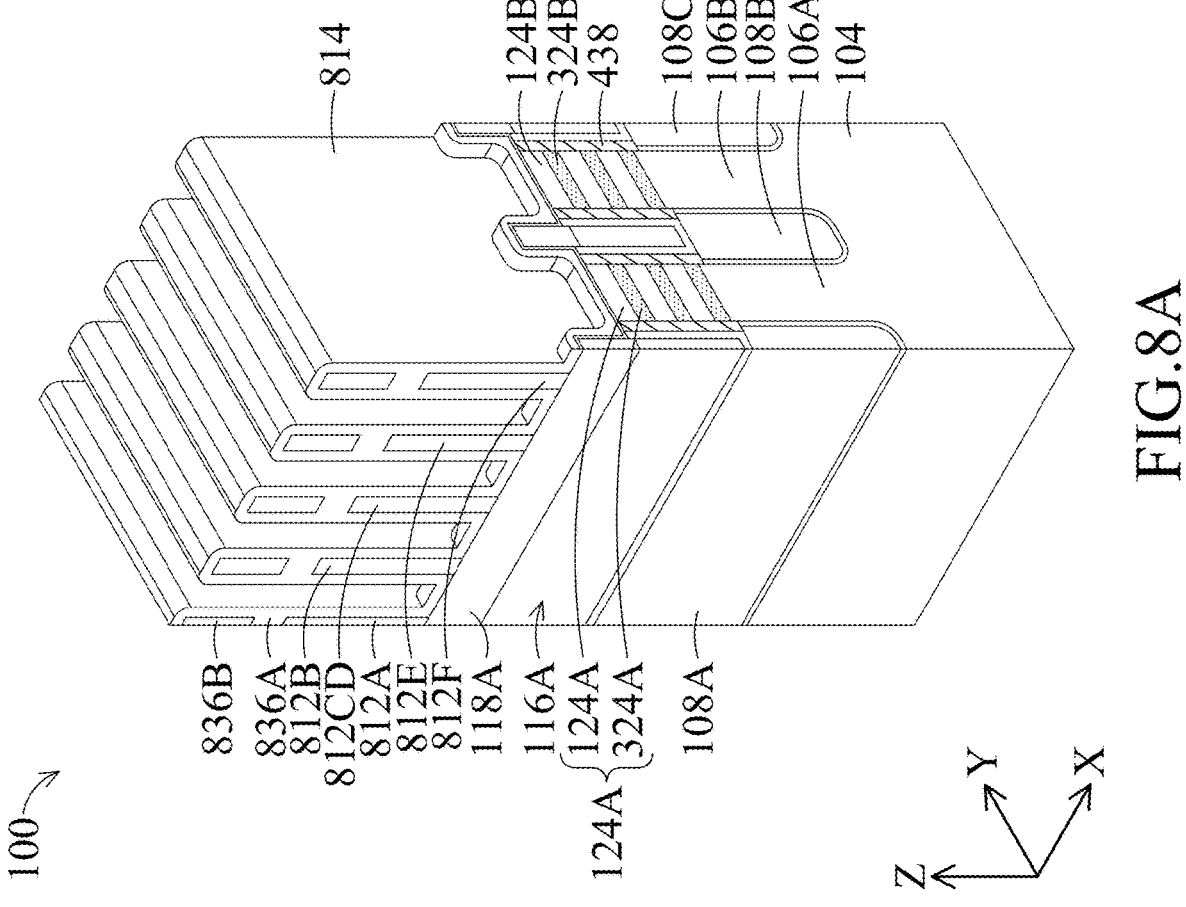
Figures 8B, 8C:
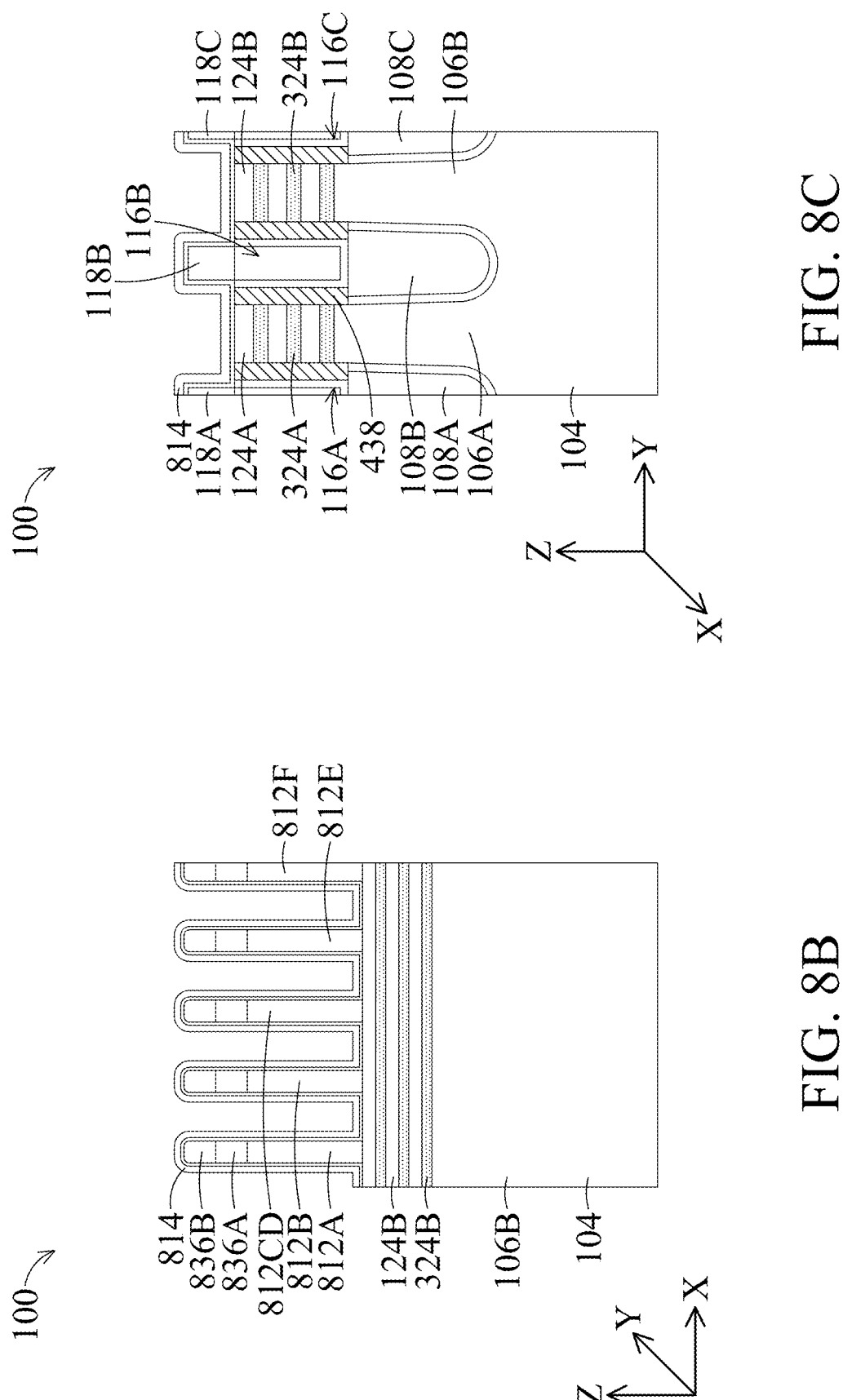

Referring to FIG. 2, in operation 225, polysilicon structures are formed on the first isolation structures, the cladding layers, and the superlattice structures. For example, as described with reference to FIGS. 7A-8C, polysilicon structures 812A, 812B, 812CD, 812E, and 812F are formed on barrier layers 118A-118E, cladding layers 438, and superlattice structures 323A-323D. The formation of polysilicon structures 812A, 812B, 812CD, 812E, and 812F can include sequential operations of (i) performing an etch process on the structures of FIGS. 6A-6C to remove masking layers 336A-336B, as shown in FIGS. 7A-7C, (ii) depositing a polysilicon layer (not shown) on the structures of FIGS. 7A-7C, and (iii) performing a patterning process (e.g., lithography process) on the polysilicon layer to form polysilicon structures 812A, 812B, 812CD, 812E, and 812F, as shown in FIGS. 8A-8C. In some embodiments, HM layers 836A-836B can be formed during the formation of polysilicon structures 812A, 812B, 812CD, 812E, and 812F. In some embodiments, outer gate spacers 114 can be formed after the formation of polysilicon structures 812A, 812B, 812CD, 812E, and 812F by (i) depositing a spacer material layer 814 on polysilicon structures 812A, 812B, 812CD, 812E, and 812F and HM layers 836A-836B, as shown in FIGS. 8A-8C, and (ii) performing a CMP process on the structures of FIGS. 8A-8C to form outer gate spacers 114, as shown in FIGS. 9A-9C.

Referring to FIG. 2, in operation 230, S/D regions are formed on the fin bases. For example, as described with reference to FIGS. 9A-9C, S/D regions 110A2, 110B2, 110C2, and 110D2 are formed on fin base 106B. Similarly, S/D regions 110A1, 110B1, 110C1, and 110D1 are formed on fin base 106A, S/D regions 110A3, 110B3, 110C3, and 110D3 are formed on fin base 106C, and S/D regions 110A4, 110B4, 110C4, and 110D4 are formed on fin base 106D, which are not shown in FIGS. 9A-9C for simplicity. S/D regions 110A2, 110B2, 110C2, and 110D2 are not visible in the cross-sectional views of FIGS. 9A and 9C.

The formation of S/D regions 110A2, 110B2, 110C2, and 110D2 can include sequential operations of (i) forming S/D openings (not shown) in portions of superlattice structure 323B, fin base 106B, and cladding layers 438 that are non-overlapping with outer gate spacers 114 and polysilicon structures 812A, 812B, 812CD, 812E, and 812F, and (ii) epitaxially growing semiconductor materials in S/D openings, as shown in FIG. 9B. In some embodiments, inner spacers 115 can be formed between operations (i) and (ii) of the formation process of S/D regions 110A2, 110B2, 110C2, and 110D2. In some embodiments, after the formation of S/D regions 110A2, 110B2, 110C2, and 110D2, ESLs 120, ILD layers 122, and HM layers 125 can be formed, as shown in FIGS. 9A and 9B.

Figure 10A:
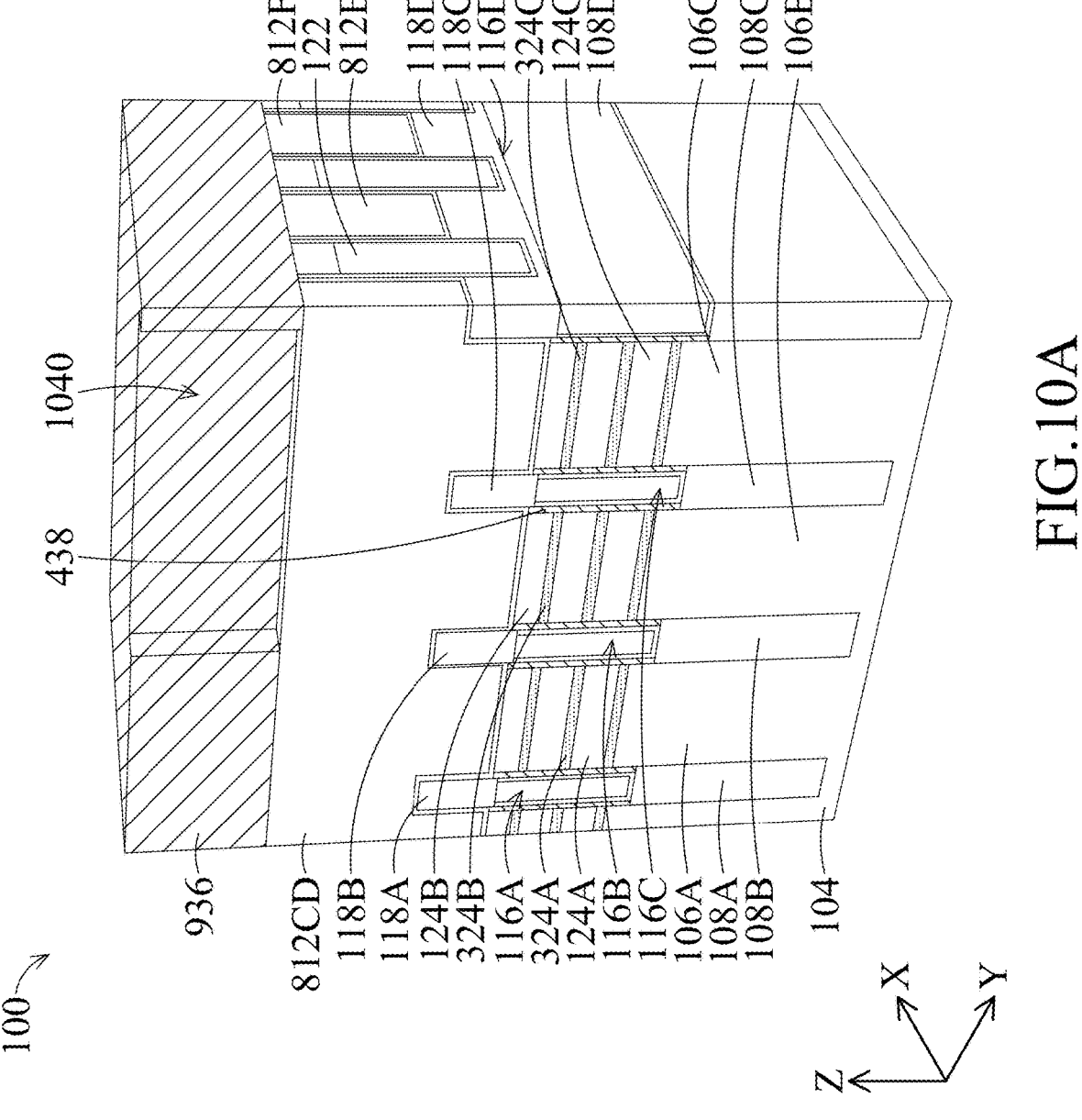
Figures 10B, 10C:
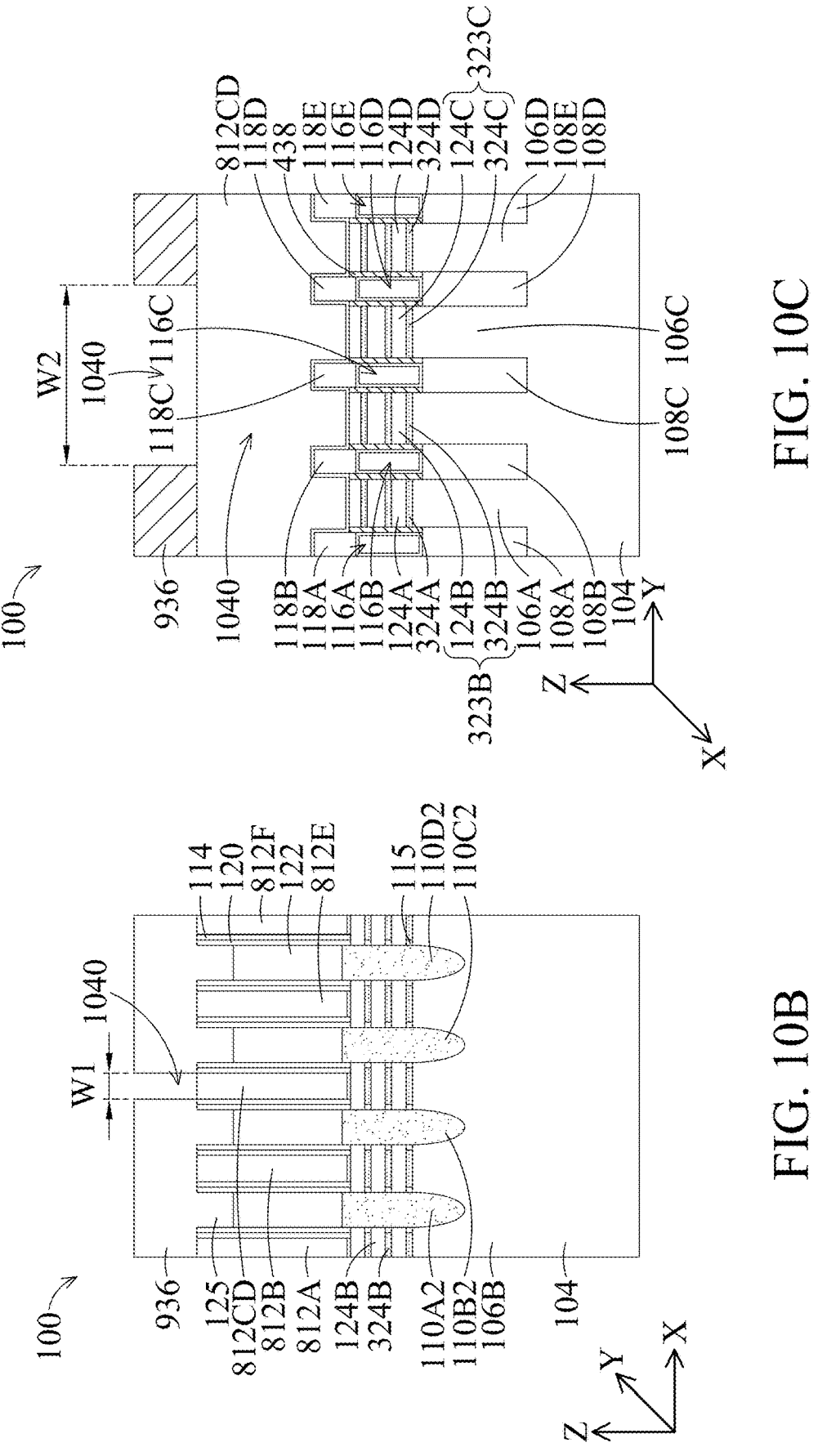
Figure 11A:
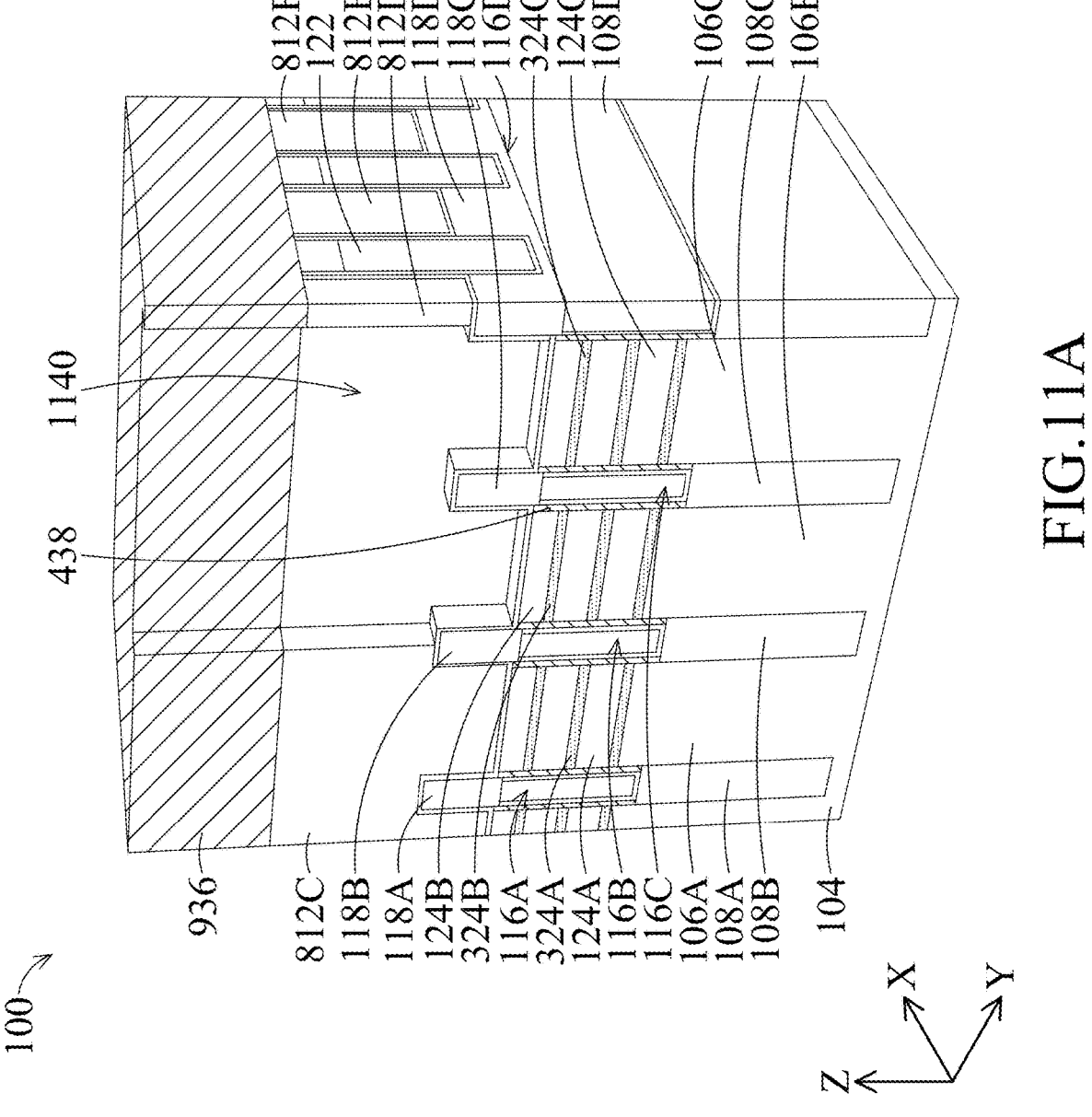
Figures 11B, 11C:
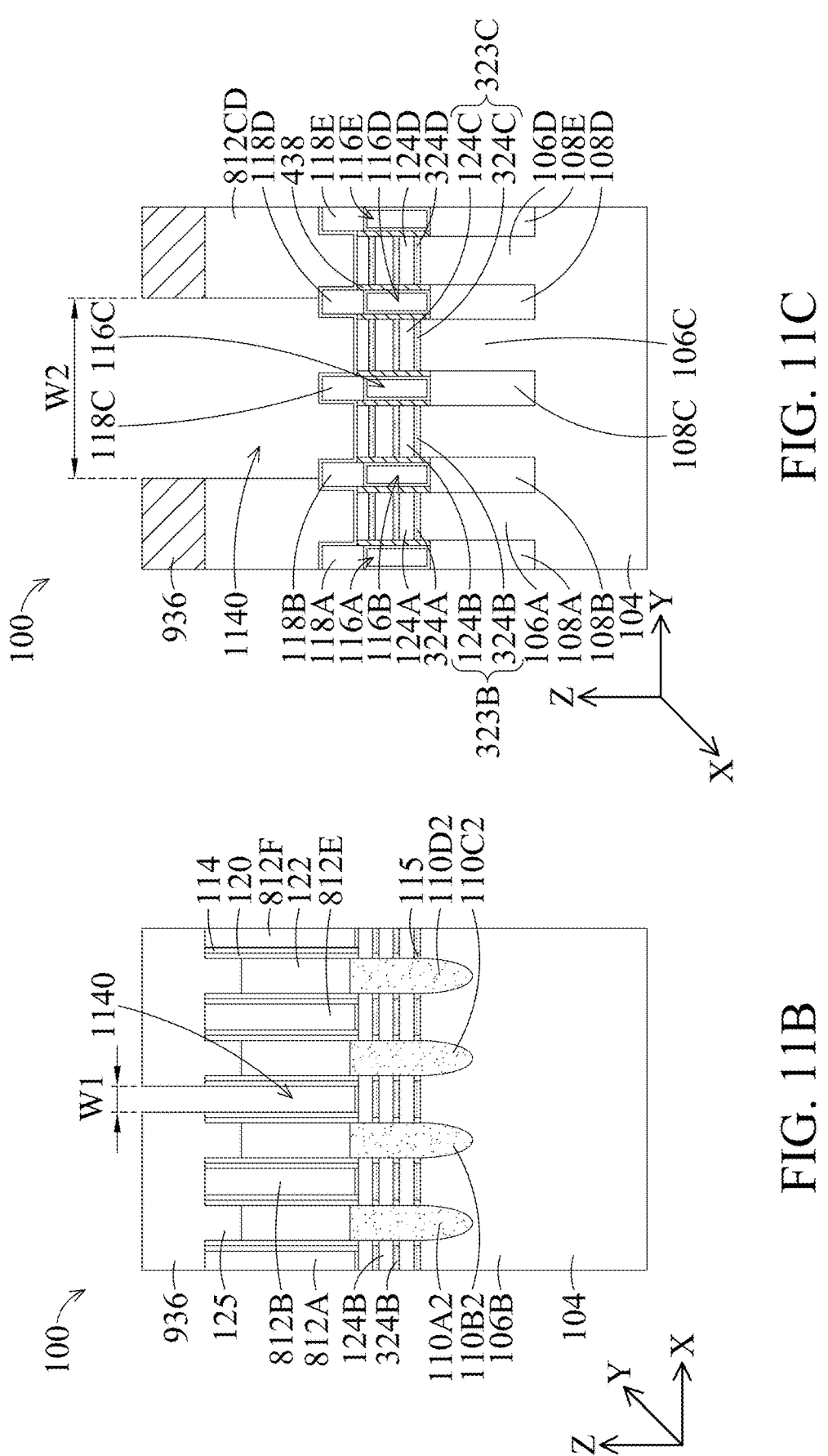
Figure 12A:
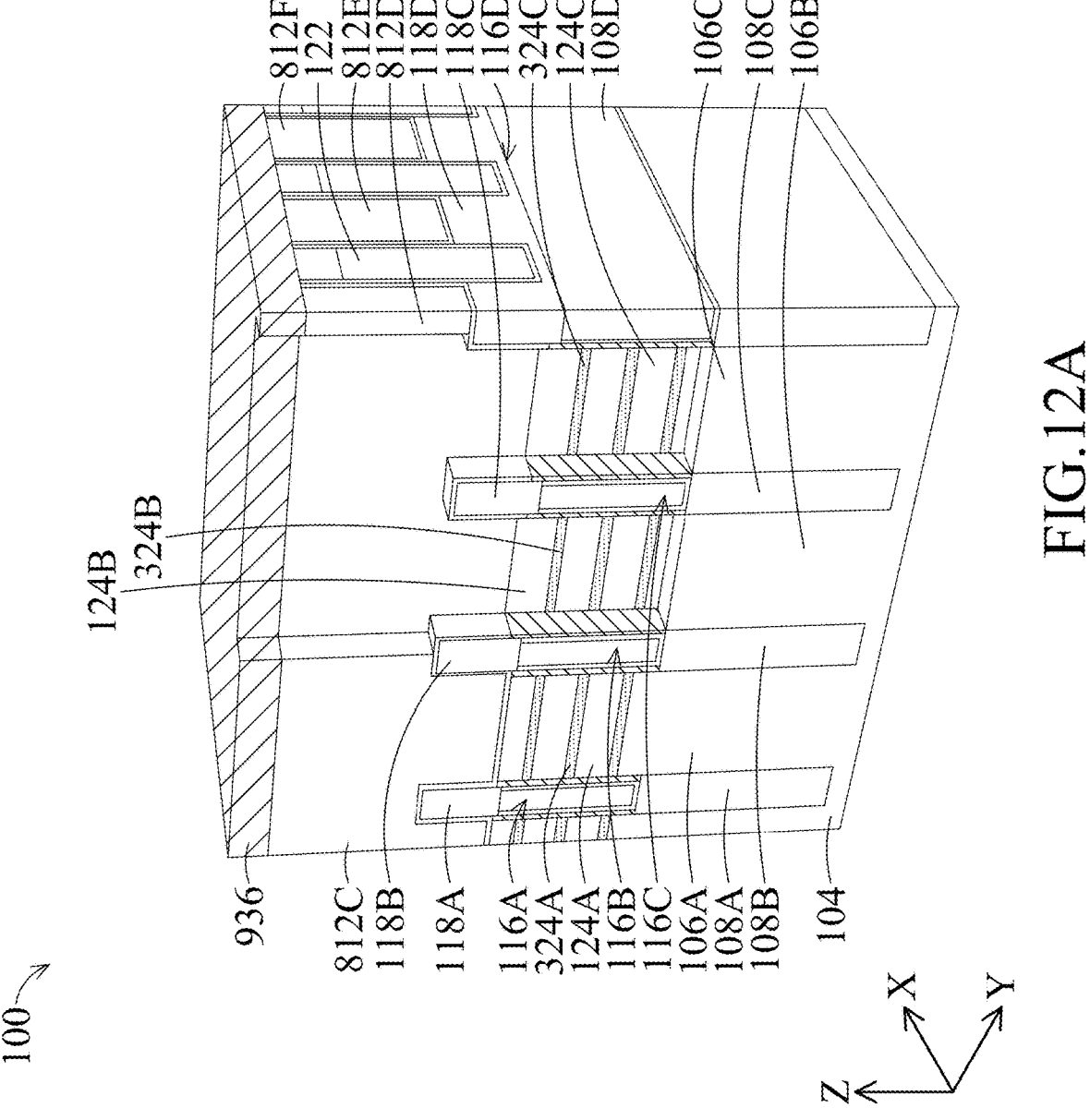
Figures 12B, 12C:
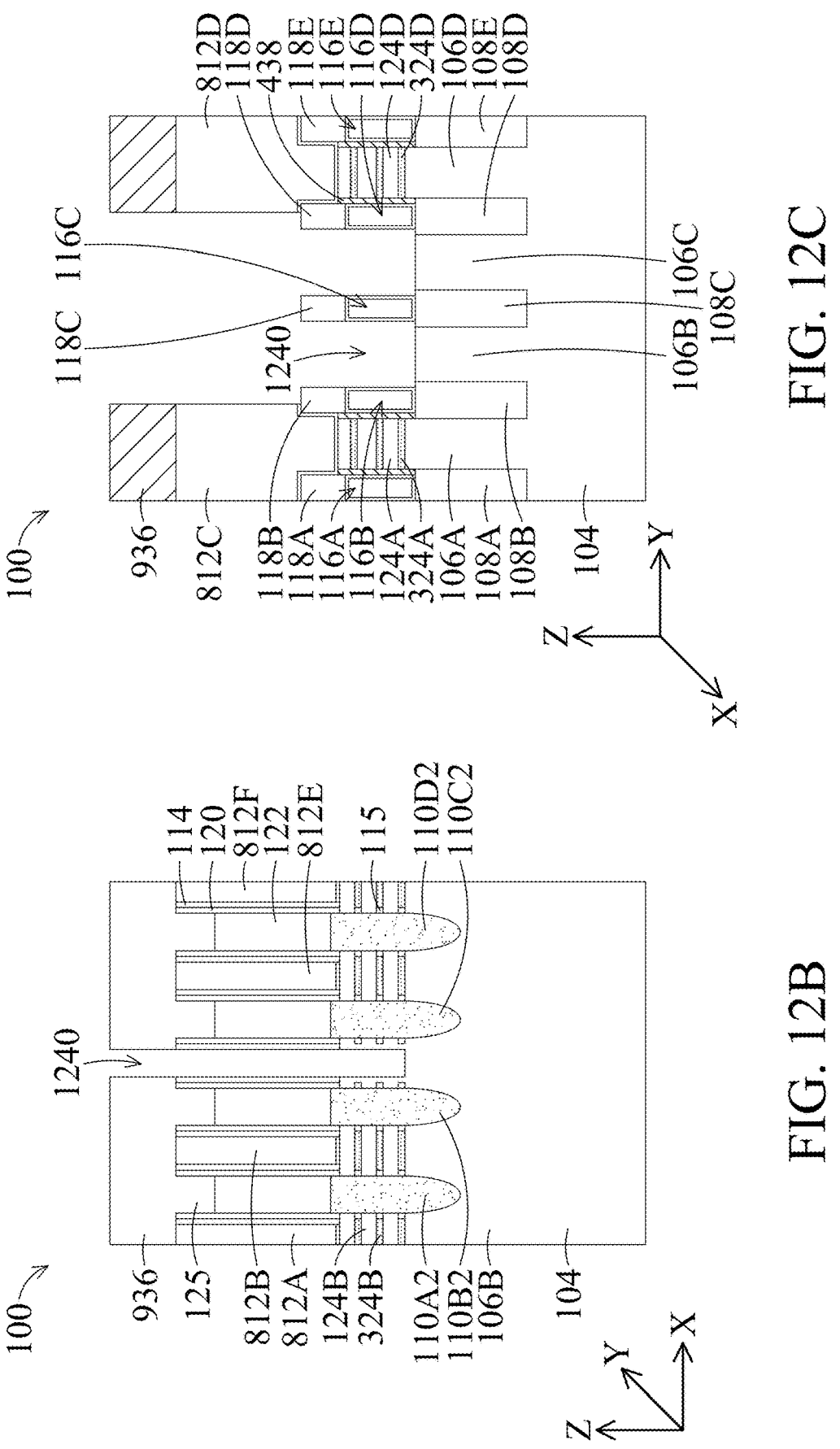
Figures 12D, 12E:
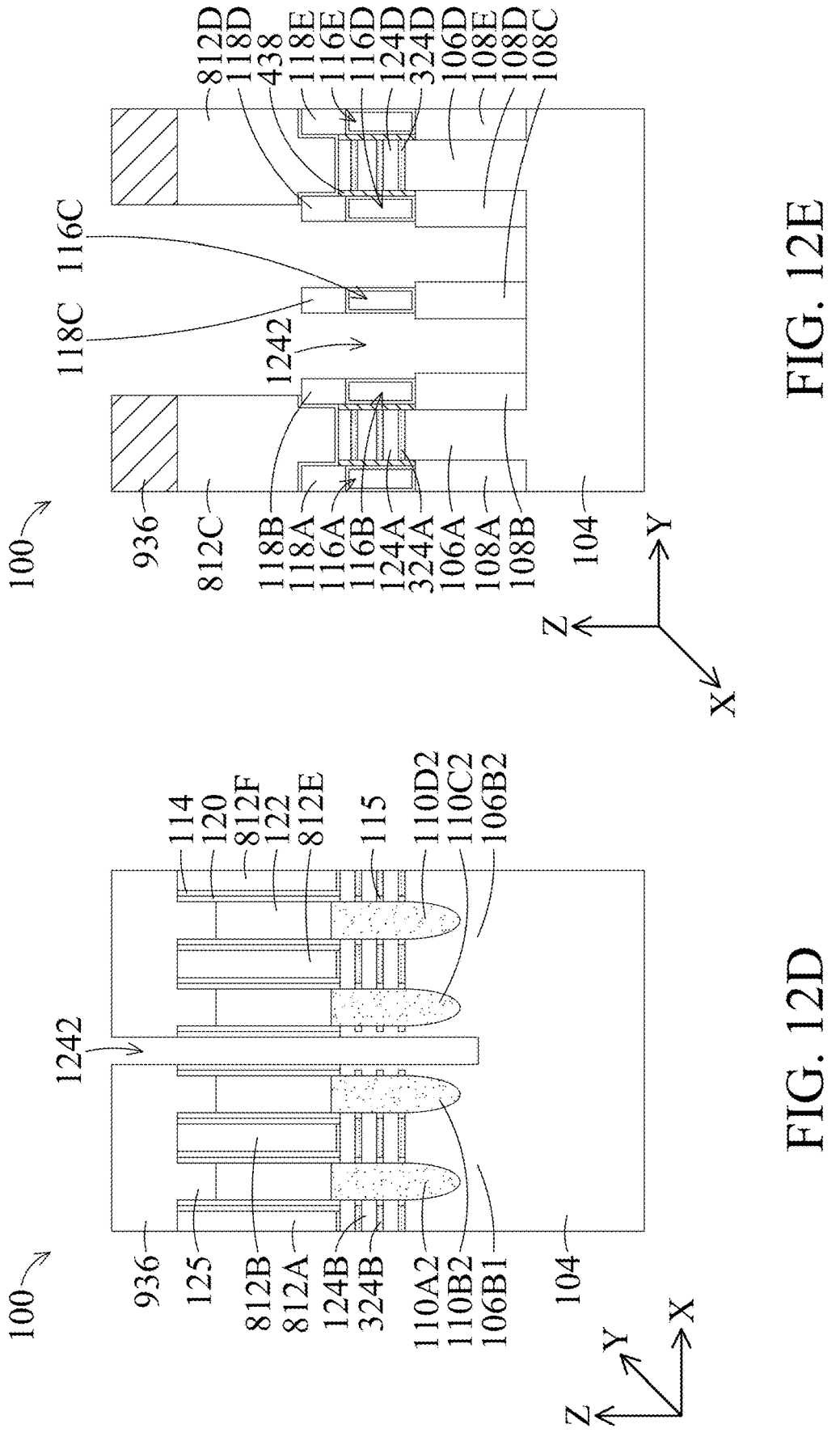
Figure 13A:
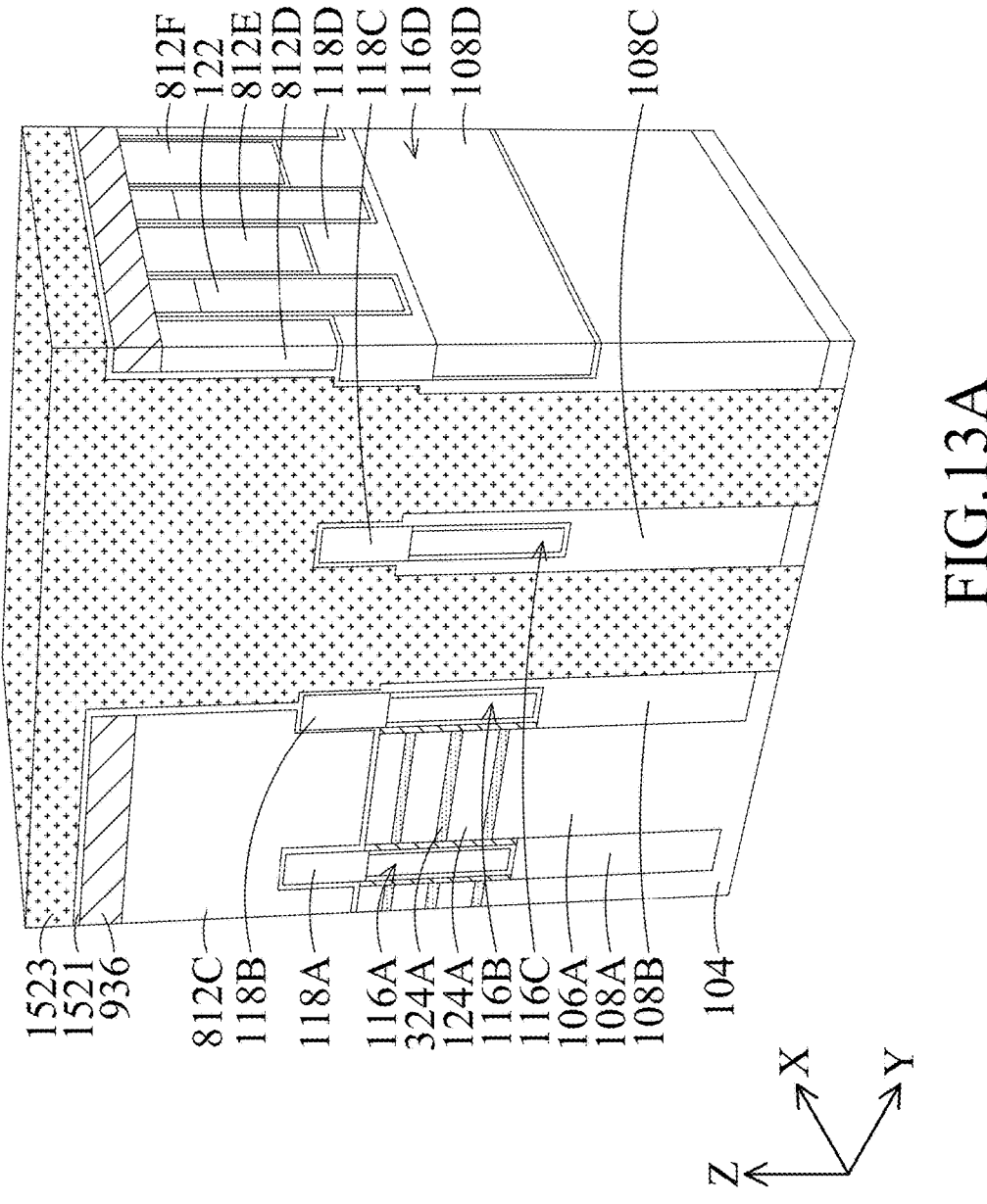
Figures 13B, 13C:
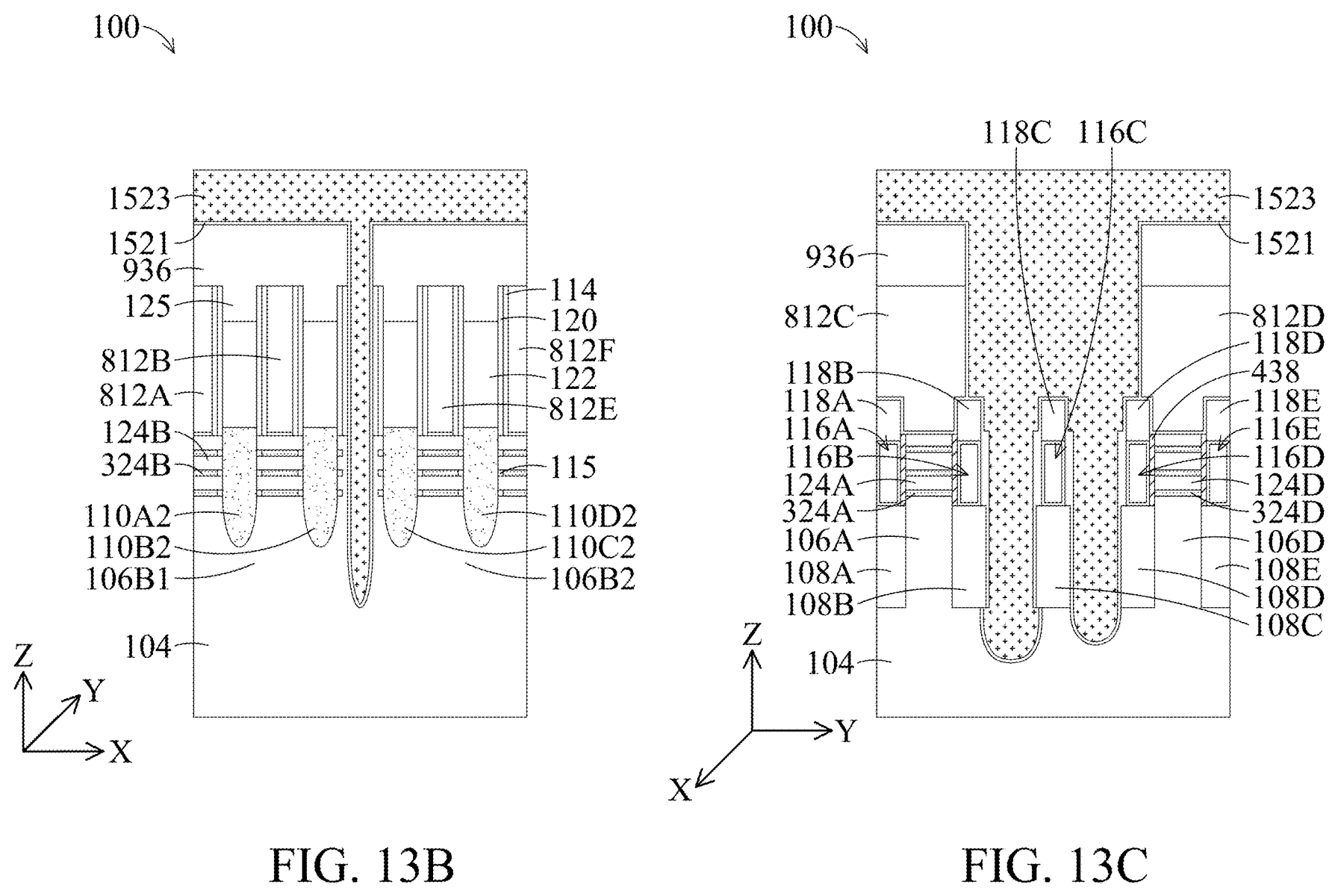
Figures 14B, 14C:
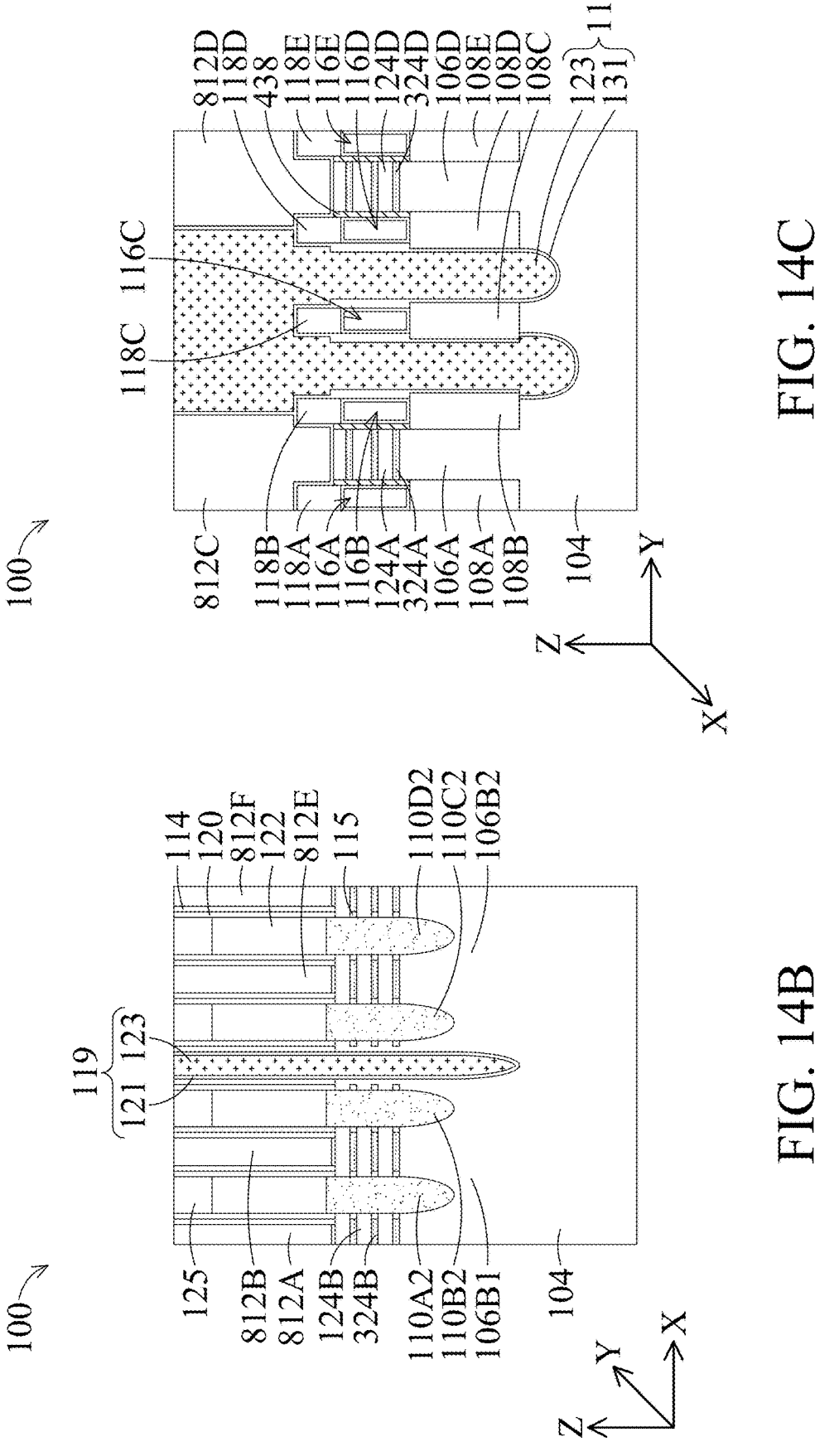

Referring to FIG. 2, in operation 235, a second isolation structure is formed on the substrate. For example, as described with reference to FIGS. 10A-11C, 12A-12M, and 13A-14C, second isolation structure 119 is formed on substrate 104. The formation of second isolation structure 119 can include sequential operations of (i) depositing a masking layer 936 (e.g., photoresist), as shown in FIGS. 10A-10C, (ii) forming an opening 1040 with dimensions of W1 by W2 on polysilicon structure 812CD using a lithographic process, as shown in FIGS. 10A-10C, (iii) etching the portion of polysilicon structure 812CD that is exposed in opening 1040 to form opening 1140 and polysilicon structures 812C and 812D, as shown in FIGS. 11A-11C, (iv) performing a first semiconductor material etch process to remove portions of superlattice structures 323B and 323C and cladding layers 438 that are exposed in opening 1140 and form opening 1240, as shown in FIGS. 12A-12C, (v) depositing a passivation layer (not shown) along sidewalls of opening 1240 to protect S/D regions 110A1-110D4 and on top surfaces of fin bases 106B and 106C that are exposed in opening 1240, (vi) performing an etch process to remove portions of the passivation layer on top surfaces of fin bases 106B and 106C, (vii) performing a second semiconductor material etch process to remove portions of fin bases 106B and 106C that are exposed in opening 1240 and form opening 1242, as shown in FIGS. 12D-12E, (viii) performing a third semiconductor material etch process to remove portions of substrate 104 that are exposed in opening 1242 and form opening 1219 with cross-sectional profiles of FIGS. 12F-12G, FIGS. 12H-12I, FIGS. 12J-12K, or FIGS., 12L-12M, (ix) depositing an insulation oxide layer 1521 on the structures of FIGS. 12F-12G, as shown in FIGS. 13A-13C, (x) depositing an insulating nitride layer 1523 on insulating oxide layer 1521 to fill openings 1219, 1242, 1240, 1140, and 1040, as shown in FIGS. 13A-13C, and (xi) performing a CMP process on the structures of FIGS. 13A-13C to form second isolation structure 119, as shown in FIGS. 14A-14C. In some embodiments, opening 1140 is formed wider than opening 1240, which is formed wider than opening 1242 to prevent void formation in openings 1219, 1242, 1240, and 1140 during deposition of insulating nitride layer 1523.

Figures 12F, 12G:
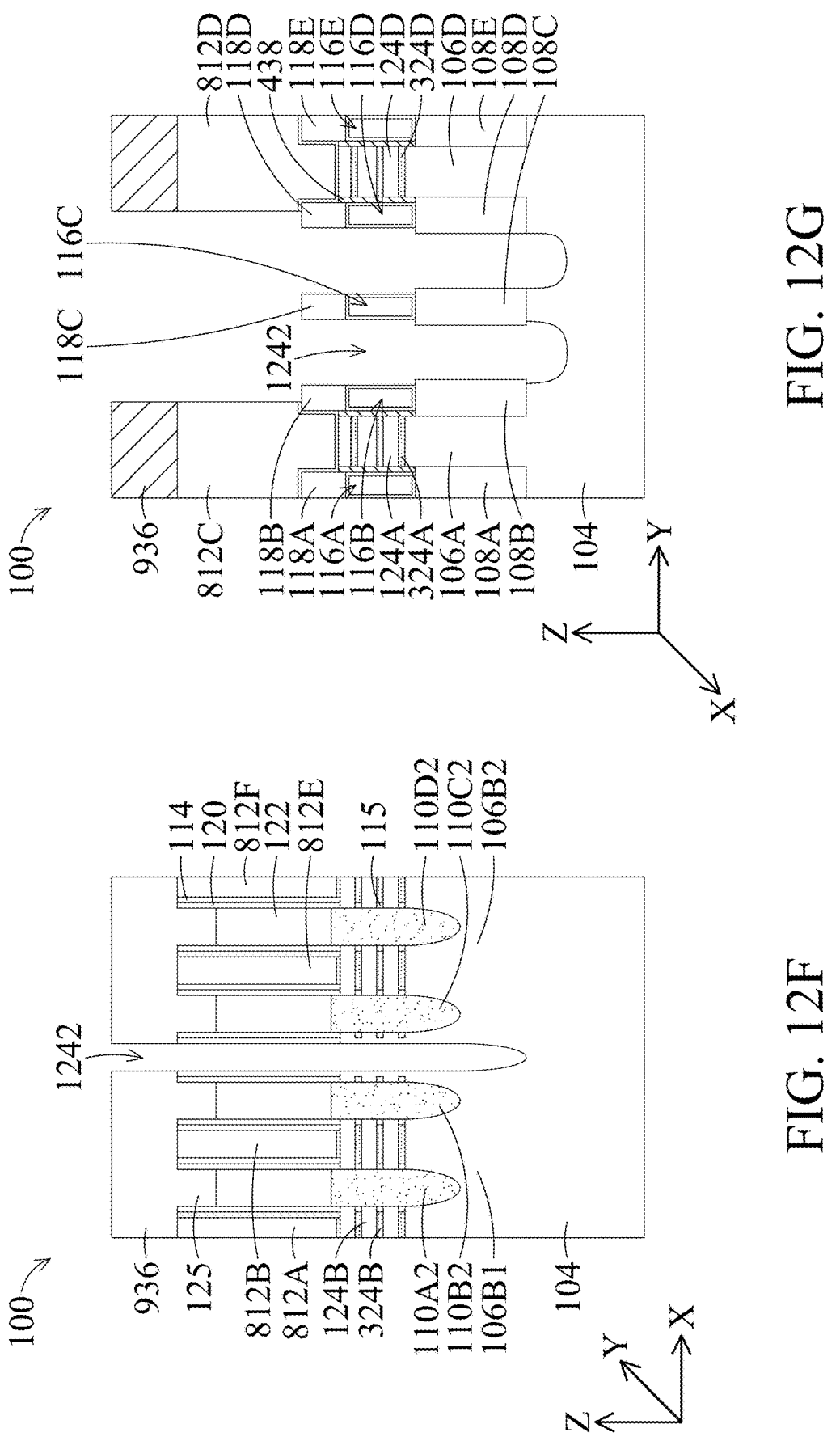
Figures 12H, 12I:
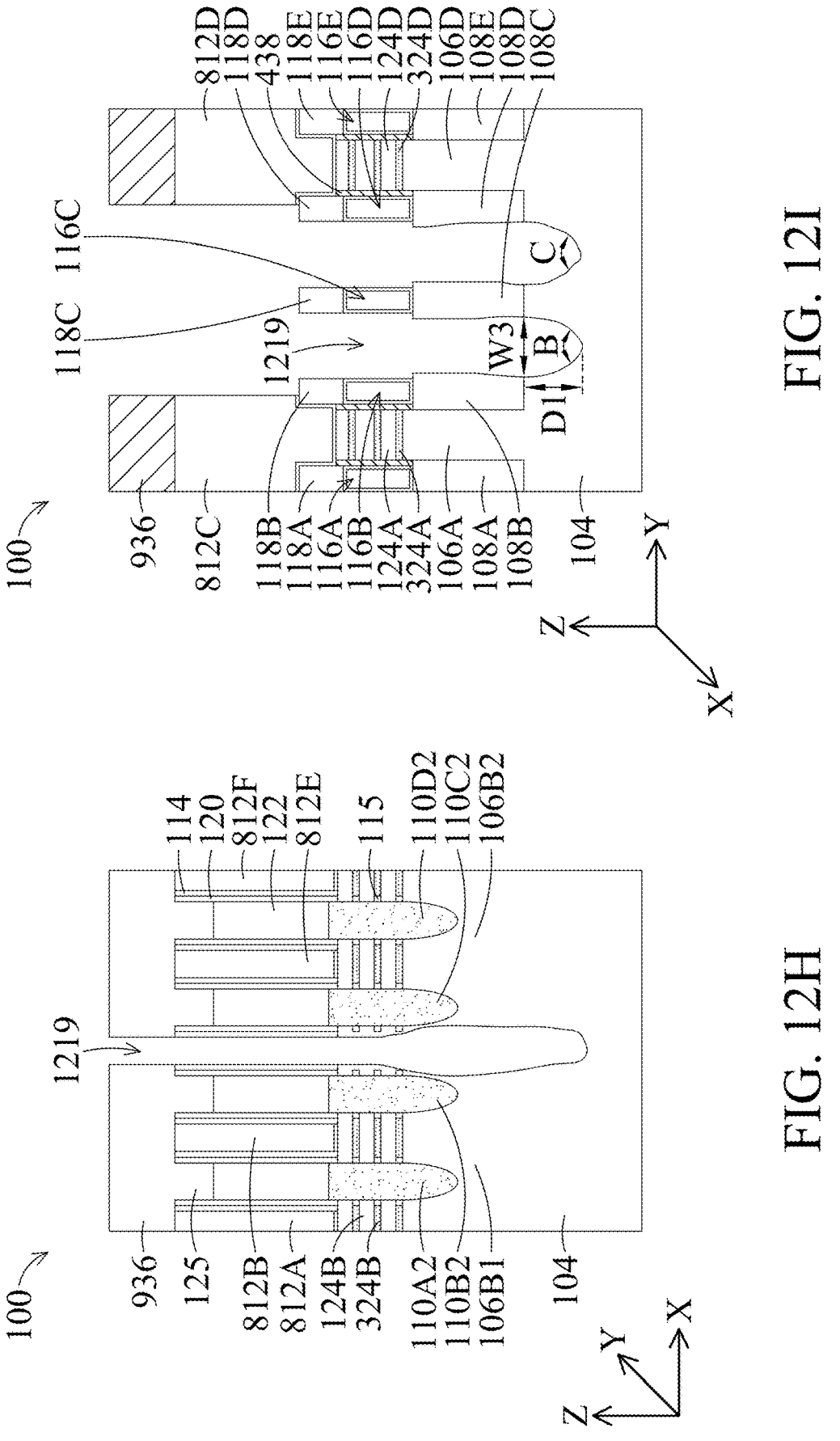
Figures 12J, 12K:
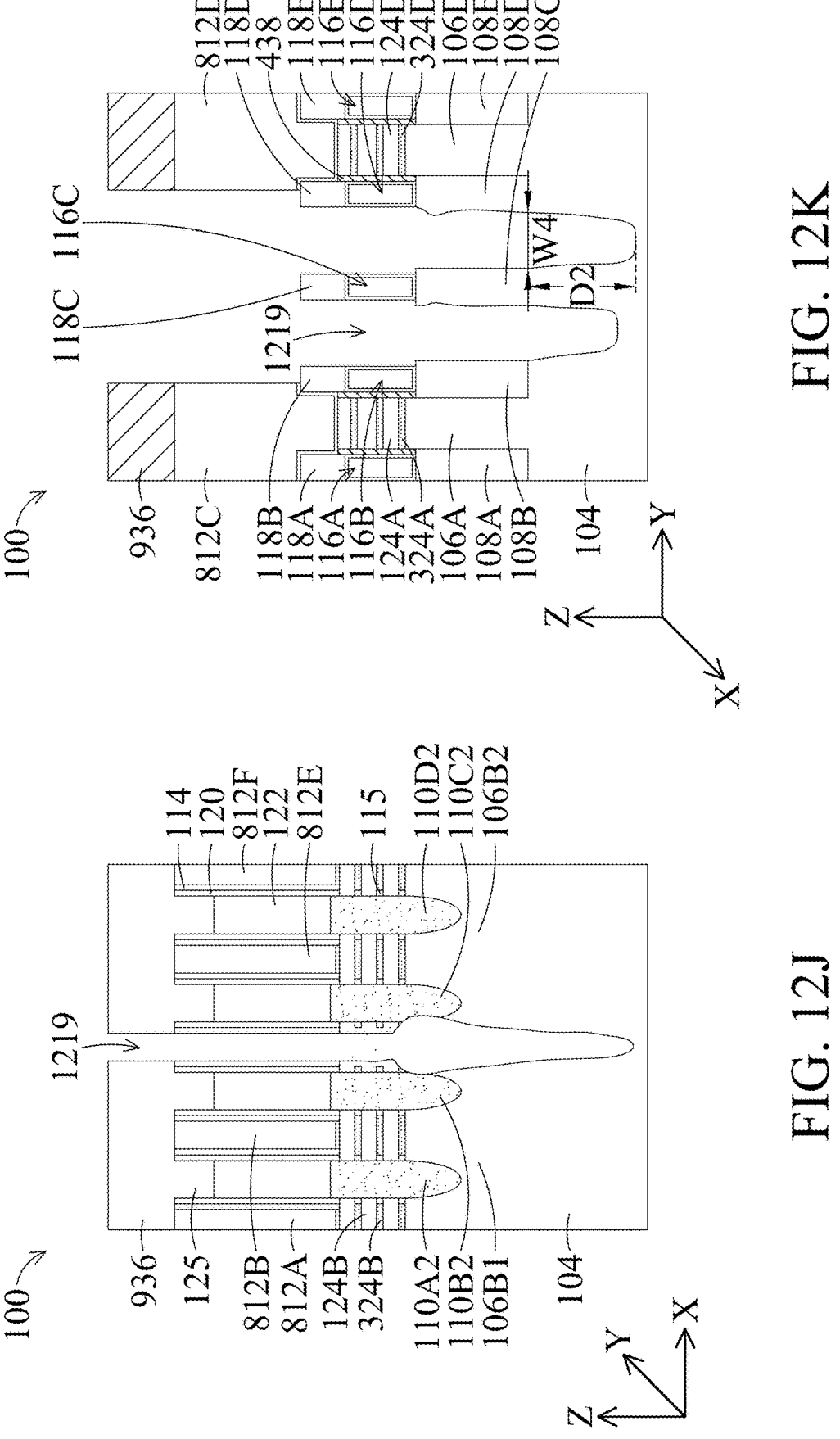
Figures 12L, 12M:
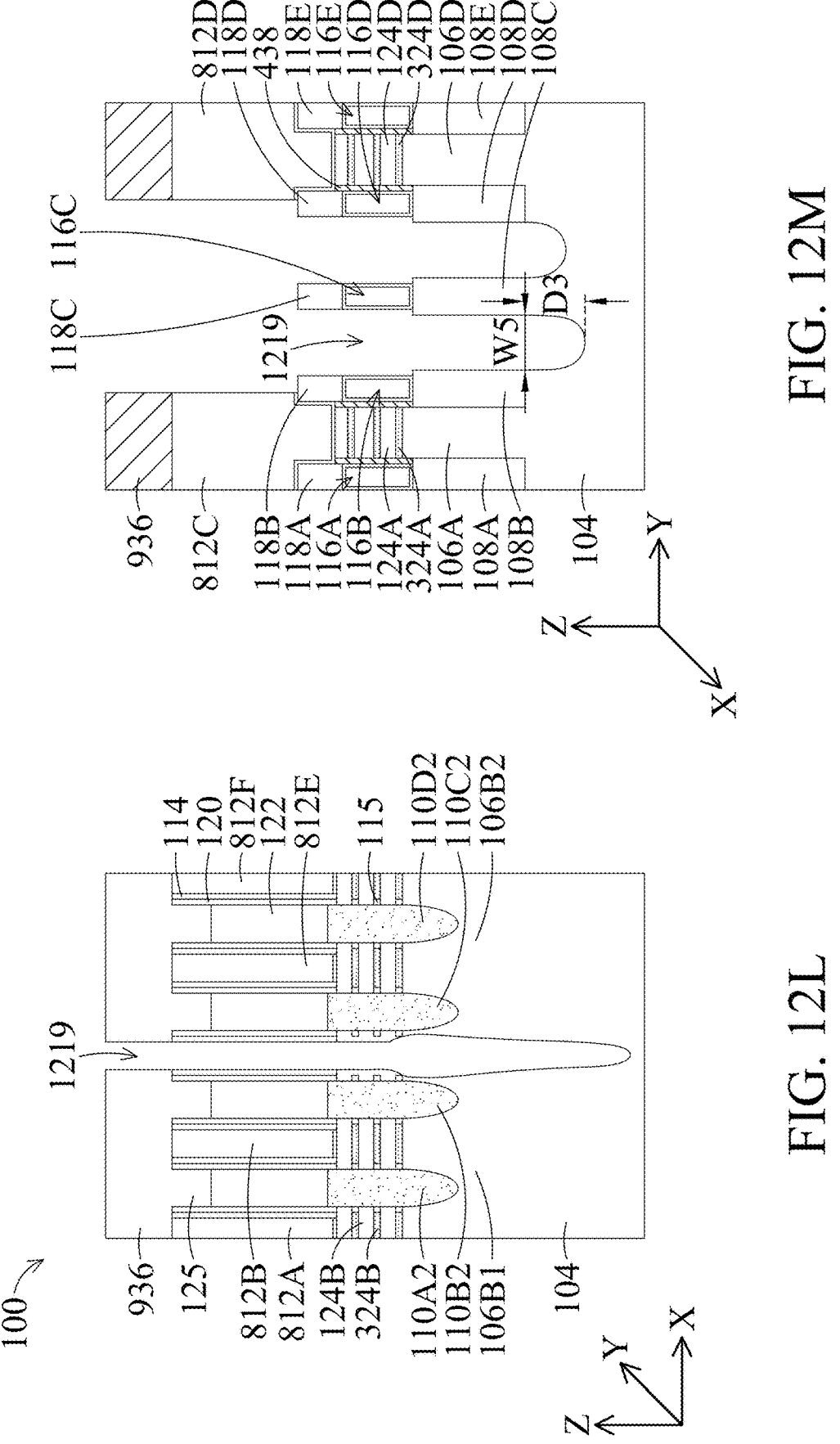

Though operations (ix), (x), and (xi) of the formation process of second isolation structure 119 are shown on the structures of FIGS. 12F-12G, operations (ix), (x), and (xi) can be similarly performed (i) on the structures of FIGS. 12H-12I to form second isolation structure 119 with the cross-sectional profiles of FIGS. 1E-1F, (ii) on the structures of FIGS. 12J-12K to form second isolation structure 119 with the cross-sectional profiles of FIGS. 1G-1H, and (iii) on the structures of FIGS. 12L-12M to form second isolation structure 119 with the cross-sectional profiles of FIGS. 1I-1J. The discussion of the cross-sectional profiles and dimensions of second isolation structure 119 of (i) FIGS. 1C-1D applies to that of isolation trench 1219 of FIGS. 12F-12G, (ii) FIGS. 1E-1F applies to that of isolation trench 1219 of FIGS. 12H-12I, (iii) FIGS. 1G-1H applies to that of isolation trench 1219 of FIGS. 12J-12K, and (iv) FIGS. 1I-1J applies to that of isolation trench 1219 of FIGS. 12L-12M.

In some embodiments, performing the first semiconductor material etch process can include performing a dry etch process in a processing chamber with a gas mixture of hydrogen halide (e.g., hydrogen bromide (HBr), hydrogen chloride (HCl), or hydrogen fluoride (HF)), oxygen, and argon. In some embodiments, the first semiconductor material etch process can further include supplying the hydrogen halide gas at a flow rate of about 100 sccm to about 1000 sccm, the oxygen gas at a flow rate of about 0 sccm to about 100 sccm, and the argon gas at a flow rate of about 100 sccm to about 1000 sccm to the processing chamber during the first semiconductor material etch process.

In some embodiments, depositing the passivation layer can include flowing a gas mixture of silicon precursor (e.g., silicon tetrachloride ($SiCl_4$) or silane ($SiH_4$)), hydrogen bromide, argon, and oxygen on the structures of FIGS. 12A-12C. In some embodiments, depositing the passivation layer can further include supplying the silicon precursor at a flow rate of about 1 sccm to about 1000 sccm, the hydrogen bromide gas at a flow rate of about 100 sccm to about 500 sccm, the oxygen gas at a flow rate of about 10 sccm to about 200 sccm, and the argon gas at a flow rate of about 100 sccm to about 1000 sccm to the deposition chamber during the deposition process.

In some embodiments, performing the etch process to remove portions of the passivation layer on top surfaces of fin bases 106B and 106C can include performing a dry etch process in the processing chamber with a gas mixture of carbon tetrafluoride (CF4) and argon. In some embodiments, the etch process can further include supplying the $CF_4$ gas at a flow rate of about 1 sccm to about 200 sccm and the argon gas at a flow rate of about 100 sccm to about 1000 sccm to the processing chamber during the etch process.

In some embodiments, performing the second semiconductor material etch process can include performing a dry etch process in a processing chamber with a gas mixture of hydrogen halide (e.g., hydrogen bromide (HBr), hydrogen chloride (HCl), or hydrogen fluoride (HF)), argon, and carbon dioxide ($CO_2$) or oxygen. In some embodiments, the second semiconductor material etch process can further include supplying the hydrogen halide gas at a flow rate of about 100 sccm to about 1000 sccm, the $CO_2$ or oxygen gas at a flow rate of about 0 sccm to about 100 sccm, and the argon gas at a flow rate of about 100 sccm to about 1000 sccm to the processing chamber during the second semiconductor material etch process.

In some embodiments, performing the third semiconductor material etch process to form isolation trench 1219 of FIGS. 12H-12I can include performing a plasma etch process in a processing chamber with a gas mixture of HBr, argon, and carbon dioxide ($CO_2$) or oxygen and a plasma having a substantially equal concentration of bromide ions and bromide radicals (e.g., concentration ratio of bromide ions to bromide radicals in the plasma is substantially equal to 1). In some embodiments, the third semiconductor material etch process can further include performing the plasma etch process at a high pressure of about 20 mTorr or greater than about 20 mTorr (e.g., between about 21 mTorr and about 200 mTorr), at a low bias power of less than about 100 W (e.g., between about 1 W and about 100 W), and at a pulsing radio frequency (RF) of about 0.1 kHz to about 10 KHz. Such high pressure, low bias power, and pulsing frequency conditions along with the substantially equal concentration of bromide ions and bromide radicals can induce an isotropic plasma etching to achieve the cross-sectional profiles of isolation trench 1219 shown in FIGS. 12H-12I. In some embodiments, the third semiconductor material etch process can further include supplying the HBr gas at a flow rate of about 100 sccm to about 1000 sccm, the $CO_2$ or oxygen gas at a flow rate of about 0 sccm to about 100 sccm, and the argon gas at a flow rate of about 100 sccm to about 1000 sccm to the processing chamber during the third semiconductor material etch process.

In some embodiments, performing the third semiconductor material etch process to form isolation trench 1219 of FIGS. 12J-12K can include performing a plasma etch process in a processing chamber with a gas mixture of HBr, argon, and carbon dioxide ($CO_2$) or oxygen and a plasma having a higher concentration of bromide ions than that of bromide radicals (e.g., concentration ratio of bromide ions to bromide radicals in the plasma is greater than 1). In some embodiments, the third semiconductor material etch process can further include performing the plasma etch process at a low pressure of less than about 20 mTorr (e.g., between about 1 mTorr and about 20 mTorr) and at a high bias power of about 100 W or greater than about 100 W (e.g., between about 101 W and about 200 W). Such low pressure and high bias power conditions along with the higher concentration of bromide ions can induce an anisotropic and directional plasma etching along a Z-axis to achieve the cross-sectional profiles of isolation trench 1219 shown in FIGS. 12J-12K. In some embodiments, the third semiconductor material etch process can further include supplying the HBr gas at a flow rate of about 100 sccm to about 1000 sccm, the $CO_2$ or oxygen gas at a flow rate of about 0 sccm to about 100 sccm, and the argon gas at a flow rate of about 100 sccm to about 1000 sccm to the processing chamber during the third semiconductor material etch process.

In some embodiments, performing the third semiconductor material etch process to form isolation trench 1219 of FIGS. 12L-12M can include performing a plasma etch process in a processing chamber with a gas mixture of HBr, argon, and carbon dioxide ($CO_2$) or oxygen and a plasma having a lower concentration of bromide ions than that of bromide radicals (e.g., concentration ratio of bromide ions to bromide radicals in the plasma is less than 1). In some embodiments, the third semiconductor material etch process can further include performing the plasma etch process at a high pressure of about 20 mTorr or greater than about 20 mTorr (e.g., between about 21 mTorr and about 100 mTorr) and at a low bias power of less than about 100 W (e.g., between about 1 W and about 100 W). Such high pressure and low bias power conditions along with the lower concentration of bromide ions can achieve the cross-sectional profiles of isolation trench 1219 shown in FIGS. 12L-12M. In some embodiments, the third semiconductor material etch process can further include supplying the HBr gas at a flow rate of about 100 sccm to about 1000 sccm, the $CO_2$ or oxygen gas at a flow rate of about 0 sccm to about 100 sccm, and the argon gas at a flow rate of about 100 sccm to about 1000 sccm to the processing chamber during the third semiconductor material etch process.

Figure 15A:
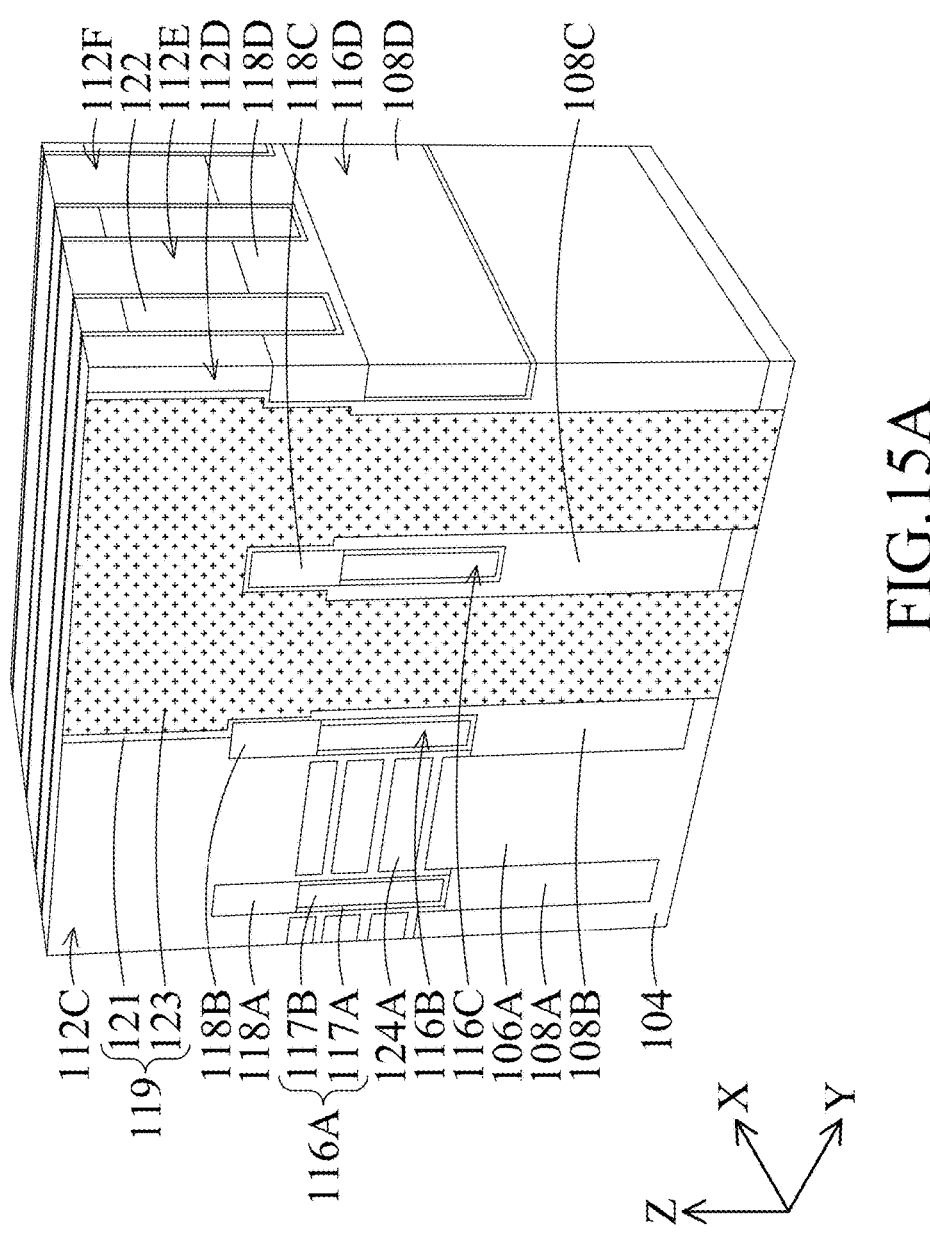
Figures 15B, 15C:
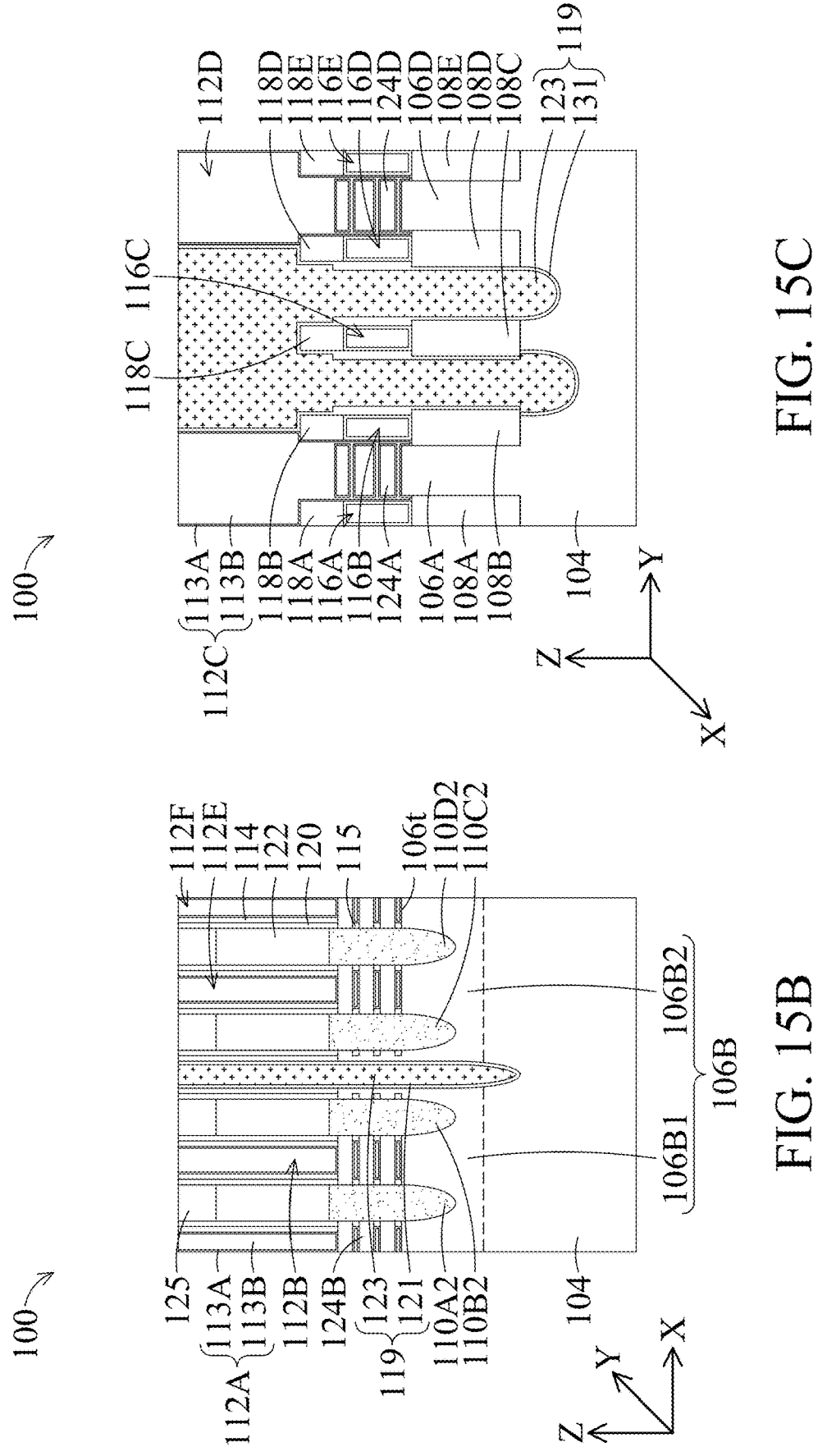

Referring to FIG. 2, in operation 240, the polysilicon structures are replaced with gate structures. For example, as described with reference to FIGS. 15A-15C, polysilicon structures 812A-812F are replaced with gate structures 112A-112F, respectively. In some embodiments, the formation of gate structures 112A-112F can include etching polysilicon structures 812A-812F and nanostructured layer 324A-324D with HK gate dielectric 113A and conductive layer 113B, as shown in FIGS. 15A-15C.

The present disclosure provides examples methods (e.g., method 200) of forming a second isolation structure (e.g., second isolation structure 119) between adjacent groups of S/D regions (e.g., S/D regions 110B2 and 110C2) on the same fin base (e.g., fin base 106B) of a GAA FET (e.g., FET 100) that can prevent or minimize current leakage between the electrically isolated groups of S/D regions (e.g., S/D regions 110B2 and 110C2) on the same fin base (e.g., fin base 106B). In some embodiments, the second isolation structure can be formed by replacing a portion of a fin base (e.g., fin base 106B) with a dielectric material (e.g., insulating oxide layer 121 and insulating nitride layer 123). The portion of the fin base can be disposed between a pair of STI regions (e.g., STI regions 108B and 108C) and is non-overlapping with S/D regions disposed on other portions of the fin base. The replacement of the portion of the fin base can include forming an isolation trench (e.g., isolation trench 1219) between the pair of STI regions by plasma etching the portion of the fin base. By controlling the plasma etching process parameters (e.g., etching gas type, etching gas flow rate, processing chamber pressure, bias power, etc.), the profile of the isolation trench can be controlled to ensure adequate removal of the portion of the fin base. In some embodiments, the cross-sectional profiles of the isolation trench (e.g., cross-sectional profiles of FIGS. 12F-12M) can have widths that gradually increase along the height of the STI regions and gradually decrease below the bottom surfaces of the STI regions. Such cross-sectional profiles of the isolation trench can ensure substantially complete removal of the portion of the fin base from the sidewalls (e.g., sidewalls 108bs) and bottom edges of the STI regions. As a result, current leakage between the S/D regions (e.g., S/D regions 110B2 and 110C2) on the fin base (e.g., fin base 106B) through any residue material of the etched portion of the fin base can be prevented or minimized, and the device performance and reliability of the GAA FET can be improved.

In some embodiments, a method includes forming first and second fin bases on a substrate, forming first and second nanostructured layers on the first and second fin bases, respectively, forming cladding layers on sidewalls of the first and second nanostructured layers, forming a polysilicon structure on the first and second nanostructured layers and the cladding layers, removing a portion of the polysilicon structure to form a first opening on the second nanostructured layers, removing a portion of the second nanostructured layers through the first opening to form a second opening on the second fin base, removing a portion of the second fin base through the second opening to form a third opening on the substrate, removing a portion of the substrate through the third opening to form a fourth opening in the substrate, and depositing an insulation material to fill the first, second, third, and fourth openings.

In some embodiments, a method includes forming first and second fin bases on a substrate, forming first and second nanostructured layers on the first and second fin bases, respectively, forming a first isolation structure between the first and second fin bases, forming a second isolation structure on the first isolation structure and between the first and second nanostructured layers, forming a polysilicon structure on the first and second nanostructured layers, and forming a third isolation structure. Forming the third isolation structure includes forming first and second isolation portions of the third isolation structure in the substrate, forming third and fourth isolation portions of the third isolation structure on opposite sides of the first isolation structure, forming fifth and sixth isolation portions of the third isolation structure on opposite sides of the second isolation structure, and forming a seventh isolation portion of the third isolation structure in the polysilicon structure.

In some embodiments, a semiconductor device includes a substrate, first and second fin bases disposed on the substrate, first and second nanostructured layers disposed on the first and second fin bases, respectively, first and second gate structures surrounding the first and second nanostructured layers, respectively, first and second shallow trench isolation (STI) regions disposed on opposite sides of the first and second fin bases, first and second first isolation structures disposed on the first and second STI regions, respectively, and a second isolation structure. The second isolation structure includes a first isolation portion disposed between the first and second gate structures, a second isolation portion disposed between and in contact with the first and second first isolation structures, a third isolation portion disposed between and in contact with the first and second STI regions, and a fourth isolation portion disposed in the substrate, where the first portion is wider than the second and third portions.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming first and second fin bases on a substrate;

forming first and second nanostructured layers on the first and second fin bases, respectively;

forming cladding layers on sidewalls of the first and second nanostructured layers;

forming a polysilicon structure on the first and second nanostructured layers and the cladding layers;

removing a portion of the polysilicon structure to form a first opening on the second nanostructured layers;

removing a portion of the second nanostructured layers through the first opening to form a second opening on the second fin base;

removing a portion of the second fin base through the second opening to form a third opening on the substrate;

removing a portion of the substrate through the third opening to form a fourth opening in the substrate; and depositing an insulation material to fill the first, second, third, and fourth openings.

2. The method of claim 1, wherein removing the portion of the substrate through the third opening comprises performing an etch process in a plasma comprising halide ions and radicals with a halide ion-to-radical concentration ratio substantially equal to 1.

3. The method of claim 1, wherein removing the portion of the substrate through the third opening comprises performing an etch process at a bias power greater than about 100 W and in a plasma comprising halide ions and radicals with a halide ion-to-radical concentration ratio greater than 1.

4. The method of claim 1, wherein removing the portion of the substrate through the third opening comprises performing an etch process at a pressure greater than about 20 mTorr and in a plasma comprising halide ions and radicals with a halide ion-to-radical concentration ratio less than 1.

5. The method of claim 1, wherein removing the portion of the substrate through the third opening comprises forming the fourth opening with curved sidewall profiles and bottom tip ends with obtuse angles.

6. The method of claim 1, wherein removing the portion of the substrate through the third opening comprises forming the fourth opening with tapered sidewall profiles and substantially planar bottom profiles.

7. The method of claim 1, further comprising removing portions of the cladding layers on the sidewalls of the second nanostructured layers during the removing of the portion of the second nanostructured layers through the first opening.

8. The method of claim 1, wherein removing the portion of the polysilicon structure comprises forming the first opening wider than the second opening.

9. The method of claim 1, wherein removing the portion of the second nanostructured layers comprises forming the second opening wider than the third opening.

10. The method of claim 1, wherein removing the portion of the substrate through the third opening comprises forming the fourth opening wider than the third opening.

11. A method, comprising:

forming first and second fin bases on a substrate;

forming first and second nanostructured layers on the first and second fin bases, respectively;

forming a first isolation structure between the first and second fin bases;

forming a second isolation structure on the first isolation structure and between the first and second nanostructured layers;

forming a polysilicon structure on the first and second nanostructured layers; and forming a third isolation structure, comprising:

forming first and second isolation portions of the third isolation structure in the substrate;

forming third and fourth isolation portions of the third isolation structure on opposite sides of the first isolation structure;

forming fifth and sixth isolation portions of the third isolation structure on opposite sides of the second isolation structure; and forming a seventh isolation portion of the third isolation structure in the polysilicon structure.

12. The method of claim 11, wherein forming the first and second isolation portions comprises etching portions of the substrate with a plasma comprising bromide ions and radicals with a bromide ion-to-radical concentration ratio substantially equal to 1.

13. The method of claim 11, wherein forming the first and second isolation portions comprises etching portions of the substrate at a bias power greater than about 100 W and in a plasma comprising bromide ions and radicals with a bromide ion-to-radical concentration ratio greater than 1.

14. The method of claim 11, wherein forming the first and second isolation portions comprises etching portions of the substrate at a pressure greater than about 20 mTorr and in a plasma comprising bromide ions and radicals with a bromide ion-to-radical concentration ratio less than 1.

15. The method of claim 11, wherein forming the first and second isolation portions comprises etching portions of the substrate to form first and second openings with curved sidewall profiles and bottom tip ends with obtuse angles.

16. The method of claim 11, wherein forming the first and second isolation portions comprises etching portions of the substrate to form first and second openings with tapered sidewall profiles and substantially planar bottom profiles.

17. A semiconductor device, comprising:

a substrate;

first and second fin bases disposed on the substrate;

first and second nanostructured layers disposed on the first and second fin bases, respectively;

first and second gate structures surrounding the first and second nanostructured layers, respectively;

first and second shallow trench isolation (STI) regions disposed on opposite sides of the first and second fin bases;

first and second isolation structures disposed on the first and second STI regions, respectively; and a third isolation structure, comprising:

a first isolation portion disposed between the first and second gate structures;

a second isolation portion disposed between and in contact with the first and second isolation structures;

a third isolation portion disposed between and in contact with the first and second STI regions; and a fourth isolation portion disposed in the substrate, wherein the first isolation portion is wider than the second and third isolation portions.

18. The semiconductor device of claim 17, wherein the fourth isolation portion overlaps bottom surfaces of the first and second STI regions.

19. The semiconductor device of claim 17, wherein the fourth isolation portion comprises curved sidewall profiles and bottom tip ends with obtuse angles.

20. The semiconductor device of claim 17, wherein the fourth isolation portion comprises tapered sidewall profiles and substantially planar bottom profiles.

\* \* \* \* \*